(12) United States Patent
Sulfridge

(10) Patent No.: US 7,795,134 B2
(45) Date of Patent: Sep. 14, 2010

(54) CONDUCTIVE INTERCONNECT STRUCTURES AND FORMATION METHODS USING SUPERCRITICAL FLUIDS

(75) Inventor: Marc Sulfridge, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 597 days.

(21) Appl. No.: 11/169,838

(22) Filed: Jun. 28, 2005

(65) Prior Publication Data

US 2006/0289968 A1  Dec. 28, 2006

(51) Int. Cl.
H01L 21/4763 (2006.01)

(52) U.S. Cl. .............. 438/637; 438/618; 257/621; 257/E21.464; 257/E23.145

(58) Field of Classification Search ......... 438/637, 438/618; 257/621, E21.464, E23.145
See application file for complete search history.

(56) References Cited

U.S. PATENT DOCUMENTS

| | | | |
|---|---|---|---|
| 2,821,959 A | 2/1958 | Franz | |
| 3,006,318 A | 10/1961 | Monroe, Jr. et al. | |
| 3,345,134 A | 10/1967 | Heymer et al. | |
| 3,865,298 A | 2/1975 | Allen et al. | |
| 3,902,036 A | 8/1975 | Zaleckas | |
| 4,040,168 A | 8/1977 | Huang | |
| 4,368,106 A | 1/1983 | Anthony | |
| 4,534,100 A | 8/1985 | Lane | |
| 4,581,301 A | 4/1986 | Michaelson | |
| 4,608,480 A | 8/1986 | Bizot et al. | |
| 4,614,427 A | 9/1986 | Koizumi et al. | |
| 4,627,971 A | 12/1986 | Ayer | |
| 4,660,063 A | 4/1987 | Anthony | |
| 4,756,765 A | 7/1988 | Woodroffe | |
| 4,768,291 A | 9/1988 | Palmer | |
| 4,818,728 A | 4/1989 | Rai et al. | |

(Continued)

FOREIGN PATENT DOCUMENTS

DE          10205026 C1    5/2003

(Continued)

OTHER PUBLICATIONS

J.M.Blackburn et al. "Deposition of Conformal Copper and Nickel Films from Supercritical Carbon Dioxide", Science, vol. 294, Oct. 2001, pp. 141-145.*

(Continued)

*Primary Examiner*—Asok K Sarkar
*Assistant Examiner*—Julia Slutsker
(74) *Attorney, Agent, or Firm*—Perkins Coie LLP

(57) ABSTRACT

Conductive interconnect structures and formation methods using supercritical fluids are disclosed. A method in accordance with one embodiment of the invention includes forming a via in a substrate, with the via having a width and a length generally transverse to the width, and with a length being approximately 100 microns or more. The method can further include disposing a conductive material in the via while the via is exposed to a supercritical fluid. For example, copper can be disposed in the via by introducing a copper-containing precursor into the supercritical fluid and precipitating the copper from the supercritical fluid. Interconnect structures can be formed using this technique in a single generally continuous process, and can produce conductive structures having a generally uniform grain structure across the width of the via.

40 Claims, 17 Drawing Sheets

U.S. PATENT DOCUMENTS

| | | |
|---|---|---|
| 4,906,314 A | 3/1990 | Farnworth et al. |
| 4,907,127 A | 3/1990 | Lee |
| 4,959,705 A | 9/1990 | Lemnios et al. |
| 4,964,212 A | 10/1990 | Deroux-Dauphin et al. |
| 4,984,597 A | 1/1991 | McConnell et al. |
| 5,006,922 A | 4/1991 | McShane et al. |
| 5,024,966 A | 6/1991 | Dietrich et al. |
| 5,026,964 A | 6/1991 | Somers et al. |
| 5,027,184 A | 6/1991 | Soclof |
| 5,037,782 A | 8/1991 | Nakamura et al. |
| 5,098,864 A | 3/1992 | Mahulikar |
| 5,102,829 A | 4/1992 | Cohn |
| 5,123,902 A | 6/1992 | Muller et al. |
| 5,130,783 A | 7/1992 | McLellan |
| 5,144,412 A | 9/1992 | Chang et al. |
| 5,145,099 A | 9/1992 | Wood et al. |
| 5,158,911 A | 10/1992 | Quentin et al. |
| 5,200,366 A | 4/1993 | Yamada et al. |
| 5,219,344 A | 6/1993 | Yoder, Jr. |
| 5,233,448 A | 8/1993 | Wu et al. |
| 5,237,148 A | 8/1993 | Aoki et al. |
| 5,289,631 A | 3/1994 | Koopman et al. |
| 5,291,062 A | 3/1994 | Higgins, III |
| 5,292,686 A | 3/1994 | Riley et al. |
| 5,294,568 A | 3/1994 | McNeilly et al. |
| 5,304,743 A | 4/1994 | Sen et al. |
| 5,371,397 A | 12/1994 | Maegawa et al. |
| 5,378,312 A | 1/1995 | Gifford et al. |
| 5,378,313 A | 1/1995 | Pace |
| 5,380,681 A | 1/1995 | Hsu et al. |
| 5,402,435 A | 3/1995 | Shiono et al. |
| 5,406,630 A | 4/1995 | Piosenka et al. |
| 5,424,573 A | 6/1995 | Kato et al. |
| 5,435,887 A | 7/1995 | Rothschild et al. |
| 5,438,212 A | 8/1995 | Okaniwa et al. |
| 5,447,871 A | 9/1995 | Goldstein |
| 5,464,960 A | 11/1995 | Hall et al. |
| 5,481,483 A | 1/1996 | Ebenstein |
| 5,485,039 A | 1/1996 | Fujita et al. |
| 5,496,755 A | 3/1996 | Bayraktaroglu |
| 5,505,804 A | 4/1996 | Mizuguchi et al. |
| 5,515,167 A | 5/1996 | Ledger et al. |
| 5,518,956 A | 5/1996 | Liu et al. |
| 5,550,403 A | 8/1996 | Carichner |
| 5,585,308 A | 12/1996 | Sardella |
| 5,585,675 A | 12/1996 | Knopf |
| 5,593,913 A | 1/1997 | Aoki |
| 5,605,783 A | 2/1997 | Revelli et al. |
| 5,614,743 A | 3/1997 | Mochizuki et al. |
| 5,618,752 A | 4/1997 | Gaul |
| 5,624,437 A | 4/1997 | Freeman et al. |
| 5,627,106 A | 5/1997 | Hsu et al. |
| 5,646,067 A | 7/1997 | Gaul |
| 5,654,221 A | 8/1997 | Cronin et al. |
| 5,672,519 A | 9/1997 | Song et al. |
| 5,673,846 A | 10/1997 | Gruber |
| 5,684,642 A | 11/1997 | Zumoto et al. |
| 5,690,841 A | 11/1997 | Elderstig et al. |
| 5,694,246 A | 12/1997 | Aoyama et al. |
| 5,708,293 A | 1/1998 | Ochi et al. |
| 5,718,791 A | 2/1998 | Spengler et al. |
| 5,723,904 A | 3/1998 | Shiga et al. |
| 5,726,493 A | 3/1998 | Yamashita et al. |
| 5,734,555 A | 3/1998 | McMahon |
| 5,771,158 A | 6/1998 | Yamagishi et al. |
| 5,776,824 A | 7/1998 | Farnworth et al. |
| 5,807,439 A | 9/1998 | Akatsu et al. |
| 5,811,799 A | 9/1998 | Wu |
| 5,821,532 A | 10/1998 | Beaman et al. |
| 5,825,080 A | 10/1998 | Imaoka et al. |
| 5,826,628 A | 10/1998 | Hamilton |
| 5,847,454 A | 12/1998 | Shaw et al. |
| 5,851,845 A | 12/1998 | Wood et al. |
| 5,857,963 A | 1/1999 | Pelchy et al. |
| 5,861,654 A | 1/1999 | Johnson |
| 5,870,289 A | 2/1999 | Tokuda et al. |
| 5,870,823 A | 2/1999 | Bezama et al. |
| 5,877,040 A | 3/1999 | Park et al. |
| 5,893,828 A | 4/1999 | Uram |
| 5,897,338 A | 4/1999 | Kaldenberg |
| 5,904,499 A | 5/1999 | Pace |
| 5,914,488 A | 6/1999 | Sone |
| 5,969,422 A | 10/1999 | Ting et al. |
| 5,977,535 A | 11/1999 | Rostoker |
| 5,998,240 A | 12/1999 | Hamilton et al. |
| 5,998,292 A | 12/1999 | Black et al. |
| 5,998,862 A | 12/1999 | Yamanaka |
| 6,004,867 A | 12/1999 | Kim et al. |
| 6,008,070 A | 12/1999 | Farnworth |
| 6,008,914 A | 12/1999 | Sasagawa et al. |
| 6,080,291 A | 6/2000 | Woodruff et al. |
| 6,097,087 A | 8/2000 | Farnworth et al. |
| 6,103,547 A | 8/2000 | Corisis et al. |
| 6,104,086 A | 8/2000 | Ichikawa et al. |
| 6,107,186 A | 8/2000 | Erb |
| 6,107,679 A | 8/2000 | Noguchi et al. |
| 6,110,825 A | 8/2000 | Mastromatteo et al. |
| 6,114,240 A | 9/2000 | Akram et al. |
| 6,119,335 A | 9/2000 | Park et al. |
| 6,124,634 A | 9/2000 | Akram et al. |
| 6,133,622 A | 10/2000 | Corisis et al. |
| 6,137,163 A | 10/2000 | Kim et al. |
| 6,137,182 A | 10/2000 | Hause et al. |
| 6,140,604 A | 10/2000 | Somers et al. |
| 6,143,588 A | 11/2000 | Glenn |
| 6,148,509 A | 11/2000 | Schoenfeld et al. |
| 6,159,764 A | 12/2000 | Kinsman et al. |
| 6,180,518 B1 | 1/2001 | Layadi et al. |
| 6,184,060 B1 | 2/2001 | Siniaguine |
| 6,184,465 B1 | 2/2001 | Corisis |
| 6,187,615 B1 | 2/2001 | Kim et al. |
| 6,191,487 B1 | 2/2001 | Rodenbeck et al. |
| 6,203,539 B1 | 3/2001 | Shimmick et al. |
| 6,221,769 B1 | 4/2001 | Dhong et al. |
| 6,222,136 B1 | 4/2001 | Appelt et al. |
| 6,222,270 B1 | 4/2001 | Lee |
| 6,228,687 B1 | 5/2001 | Akram et al. |
| 6,229,202 B1 | 5/2001 | Corisis |
| 6,235,552 B1 | 5/2001 | Kwon et al. |
| 6,236,046 B1 | 5/2001 | Watabe et al. |
| 6,246,108 B1 | 6/2001 | Corisis et al. |
| 6,252,300 B1 | 6/2001 | Hsuan et al. |
| 6,259,083 B1 | 7/2001 | Kimura |
| 6,266,197 B1 | 7/2001 | Glenn et al. |
| 6,271,580 B1 | 8/2001 | Corisis |
| 6,274,927 B1 | 8/2001 | Glenn |
| 6,277,757 B1 | 8/2001 | Lin et al. |
| 6,285,064 B1 | 9/2001 | Foster |
| 6,291,894 B1 | 9/2001 | Farnworth et al. |
| 6,294,837 B1 | 9/2001 | Akram et al. |
| 6,297,155 B1 | 10/2001 | Simpson et al. |
| 6,324,253 B1 | 11/2001 | Yuyama et al. |
| 6,326,689 B1 | 12/2001 | Thomas |
| 6,326,697 B1 | 12/2001 | Farnworth |
| 6,329,632 B1 | 12/2001 | Fournier et al. |
| 6,341,009 B1 | 1/2002 | O'Connor et al. |
| 6,344,976 B1 | 2/2002 | Schoenfeld et al. |
| 6,351,027 B1 | 2/2002 | Giboney et al. |
| 6,359,254 B1 | 3/2002 | Brown |
| 6,359,328 B1 | 3/2002 | Dubin |
| 6,372,548 B2 | 4/2002 | Bessho et al. |
| 6,388,208 B1 | 5/2002 | Kiani et al. |
| 6,391,770 B2 | 5/2002 | Kosaki et al. |
| 6,406,636 B1 | 6/2002 | Vaganov |

| | | |
|---|---|---|
| 6,407,381 B1 | 6/2002 | Glenn et al. |
| 6,411,439 B2 | 6/2002 | Nishikawa |
| 6,432,821 B1 | 8/2002 | Dubin et al. |
| 6,433,303 B1 | 8/2002 | Liu et al. |
| 6,433,304 B2 | 8/2002 | Okumura et al. |
| 6,437,284 B1 | 8/2002 | Okamoto et al. |
| 6,437,441 B1 | 8/2002 | Yamamoto et al. |
| 6,444,576 B1 * | 9/2002 | Kong .................... 438/667 |
| 6,448,106 B1 | 9/2002 | Wang et al. |
| 6,455,425 B1 | 9/2002 | Besser et al. |
| 6,457,515 B1 | 10/2002 | Vafai et al. |
| 6,459,039 B1 | 10/2002 | Bezama et al. |
| 6,459,150 B1 | 10/2002 | Wu et al. |
| 6,468,889 B1 | 10/2002 | Iacoponi et al. |
| 6,483,652 B2 | 11/2002 | Nakamura |
| 6,486,083 B1 | 11/2002 | Mizuno et al. |
| 6,486,549 B1 | 11/2002 | Chiang et al. |
| 6,503,780 B1 | 1/2003 | Glenn et al. |
| 6,521,516 B2 | 2/2003 | Monzon et al. |
| 6,521,530 B2 | 2/2003 | Peters et al. |
| 6,534,192 B1 | 3/2003 | Abys et al. |
| 6,541,762 B2 | 4/2003 | Knag et al. |
| 6,545,563 B1 | 4/2003 | Smith |
| 6,555,782 B2 | 4/2003 | Isaji et al. |
| 6,560,047 B2 | 5/2003 | Choi et al. |
| 6,566,745 B1 | 5/2003 | Beyne et al. |
| 6,569,711 B1 | 5/2003 | Susko et al. |
| 6,569,777 B1 | 5/2003 | Hsu et al. |
| 6,572,606 B2 | 6/2003 | Kliewer et al. |
| 6,576,531 B1 | 6/2003 | Peng et al. |
| 6,580,174 B2 | 6/2003 | McCormick et al. |
| 6,582,987 B2 | 6/2003 | Jun et al. |
| 6,582,992 B2 | 6/2003 | Poo et al. |
| 6,593,644 B2 | 7/2003 | Chiu et al. |
| 6,599,436 B1 | 7/2003 | Matzke et al. |
| 6,603,183 B1 | 8/2003 | Hoffman |
| 6,606,251 B1 | 8/2003 | Kenny, Jr. et al. |
| 6,617,623 B2 | 9/2003 | Rhodes |
| 6,620,031 B2 | 9/2003 | Renteln |
| 6,620,731 B1 | 9/2003 | Farnworth et al. |
| 6,621,045 B1 | 9/2003 | Liu et al. |
| 6,638,410 B2 | 10/2003 | Chen et al. |
| 6,653,236 B2 * | 11/2003 | Wai et al. .................... 438/687 |
| 6,658,818 B2 | 12/2003 | Kurth et al. |
| 6,660,622 B2 | 12/2003 | Chen et al. |
| 6,660,630 B1 | 12/2003 | Chang et al. |
| 6,661,047 B2 | 12/2003 | Rhodes |
| 6,664,129 B2 | 12/2003 | Siniaguine |
| 6,664,485 B2 | 12/2003 | Bhatt et al. |
| 6,667,551 B2 | 12/2003 | Hanaoka et al. |
| 6,670,986 B1 | 12/2003 | Ben Shoshan et al. |
| 6,680,459 B2 | 1/2004 | Kanaya et al. |
| 6,686,588 B1 | 2/2004 | Webster et al. |
| 6,699,787 B2 | 3/2004 | Mashino et al. |
| 6,703,310 B2 * | 3/2004 | Mashino et al. ............ 438/666 |
| 6,708,405 B2 | 3/2004 | Hasler et al. |
| 6,864,172 B2 | 4/2004 | Noma et al. |
| 6,734,419 B2 | 5/2004 | Glenn et al. |
| 6,746,971 B1 | 6/2004 | Ngo et al. |
| 6,750,144 B2 | 6/2004 | Taylor |
| 6,756,564 B2 | 6/2004 | Tian |
| 6,759,266 B1 | 7/2004 | Hoffman |
| 6,774,486 B2 | 8/2004 | Kinsman |
| 6,777,244 B2 | 8/2004 | Pepper et al. |
| 6,778,046 B2 | 8/2004 | Stafford et al. |
| 6,780,749 B2 | 8/2004 | Masumoto et al. |
| 6,790,775 B2 | 9/2004 | Fartash |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,809,025 B2 | 10/2004 | Sandhu et al. |
| 6,809,421 B1 | 10/2004 | Hayasaka et al. |
| 6,813,154 B2 | 11/2004 | Diaz et al. |
| 6,818,464 B2 | 11/2004 | Heschel et al. |
| 6,825,127 B2 | 11/2004 | Ouellet et al. |
| 6,825,458 B1 | 11/2004 | Moess et al. |
| 6,825,557 B2 | 11/2004 | DiBattista et al. |
| 6,828,175 B2 | 12/2004 | Wood et al. |
| 6,828,223 B2 | 12/2004 | Chuang |
| 6,828,663 B2 | 12/2004 | Chen et al. |
| 6,828,674 B2 | 12/2004 | Karpman |
| 6,838,377 B2 | 1/2005 | Tonami et al. |
| 6,841,849 B2 | 1/2005 | Miyazawa |
| 6,844,978 B2 | 1/2005 | Harden et al. |
| 6,847,109 B2 | 1/2005 | Shim |
| 6,852,621 B2 | 2/2005 | Hanaoka et al. |
| 6,856,023 B2 | 2/2005 | Muta et al. |
| 6,858,891 B2 | 2/2005 | Farnworth et al. |
| 6,864,457 B1 | 3/2005 | Alexander et al. |
| 6,867,390 B2 | 3/2005 | Clauer et al. |
| 6,873,054 B2 | 3/2005 | Miyazawa et al. |
| 6,882,021 B2 | 4/2005 | Boon et al. |
| 6,882,030 B2 | 4/2005 | Siniaguine |
| 6,885,107 B2 | 4/2005 | Kinsman |
| 6,903,012 B2 | 6/2005 | Geefay et al. |
| 6,903,442 B2 | 6/2005 | Wood et al. |
| 6,903,443 B2 | 6/2005 | Farnworth et al. |
| 6,910,268 B2 | 6/2005 | Miller |
| 6,913,952 B2 | 7/2005 | Moxham et al. |
| 6,916,725 B2 | 7/2005 | Yamaguchi et al. |
| 6,934,065 B2 | 8/2005 | Kinsman |
| 6,936,536 B2 | 8/2005 | Sinha |
| 6,939,343 B2 | 9/2005 | Sumiya |
| 6,943,056 B2 | 9/2005 | Nemoto et al. |
| 6,946,325 B2 | 9/2005 | Yean et al. |
| 6,951,627 B2 | 10/2005 | Li et al. |
| 6,953,748 B2 | 10/2005 | Yamaguchi et al. |
| 6,962,867 B2 | 11/2005 | Jackson et al. |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa et al. |
| 7,033,927 B2 | 4/2006 | Cohen et al. |
| 7,037,836 B2 | 5/2006 | Lee et al. |
| 7,041,598 B2 | 5/2006 | Sharma |
| 7,045,015 B2 | 5/2006 | Renn et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,111,149 B2 | 9/2006 | Eilert |
| 7,129,112 B2 | 10/2006 | Matsuo |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Meyers et al. |
| 7,186,650 B1 | 3/2007 | Dakshina-Murthy |
| 7,190,061 B2 | 3/2007 | Lee et al. |
| 7,199,050 B2 | 4/2007 | Hiatt |
| 7,214,615 B2 | 5/2007 | Miyazawa |
| 7,217,596 B2 | 5/2007 | Cobbley et al. |
| 7,217,888 B2 | 5/2007 | Sunohara et al. |
| 7,223,634 B2 | 5/2007 | Yamaguchi |
| 7,256,073 B2 | 8/2007 | Noma et al. |
| 7,262,134 B2 | 8/2007 | Kirby et al. |
| 7,262,495 B2 | 8/2007 | Chen et al. |
| 7,265,052 B2 | 9/2007 | Sinha |
| 7,271,482 B2 | 9/2007 | Kirby |
| 7,279,776 B2 | 10/2007 | Morimoto |
| 7,300,857 B2 | 11/2007 | Akram et al. |
| 7,317,256 B2 | 1/2008 | Williams et al. |

| | | |
|---|---|---|
| 7,378,726 B2 | 5/2008 | Punzalan et al. |
| 7,408,265 B2 | 8/2008 | Holscher et al. |
| 7,449,098 B1 | 11/2008 | Mayer et al. |
| 7,491,582 B2 | 2/2009 | Yokoyama et al. |
| 7,498,661 B2 | 3/2009 | Matsuo |
| 2001/0020739 A1 | 9/2001 | Honda |
| 2002/0005583 A1 | 1/2002 | Harada et al. |
| 2002/0006687 A1 | 1/2002 | Lam |
| 2002/0020898 A1 | 2/2002 | Vu et al. |
| 2002/0027293 A1 | 3/2002 | Hoshino |
| 2002/0057468 A1 | 5/2002 | Segawa et al. |
| 2002/0059722 A1 | 5/2002 | Murakami |
| 2002/0060208 A1 | 5/2002 | Liu et al. |
| 2002/0089025 A1 | 7/2002 | Chou |
| 2002/0094607 A1 | 7/2002 | Gebauer et al. |
| 2002/0096729 A1 | 7/2002 | Tu et al. |
| 2002/0113296 A1 | 8/2002 | Cho et al. |
| 2002/0130390 A1 | 9/2002 | Ker et al. |
| 2002/0145676 A1 | 10/2002 | Kuno et al. |
| 2002/0190371 A1 | 12/2002 | Mashino et al. |
| 2003/0014895 A1 | 1/2003 | Lizotte |
| 2003/0042564 A1 | 3/2003 | Taniguchi et al. |
| 2003/0062601 A1 | 4/2003 | Harnden et al. |
| 2003/0119308 A1 | 6/2003 | Geefay et al. |
| 2003/0148597 A1 | 8/2003 | Tan et al. |
| 2003/0216023 A1 | 11/2003 | Wark et al. |
| 2004/0004280 A1 | 1/2004 | Shibata |
| 2004/0012698 A1 | 1/2004 | Suda et al. |
| 2004/0018712 A1 | 1/2004 | Plas et al. |
| 2004/0023447 A1 | 2/2004 | Hirakata et al. |
| 2004/0023469 A1 | 2/2004 | Suda |
| 2004/0038442 A1 | 2/2004 | Kinsman |
| 2004/0041261 A1 | 3/2004 | Kinsman |
| 2004/0043607 A1 | 3/2004 | Farnworth et al. |
| 2004/0046251 A1 | 3/2004 | Lee |
| 2004/0073607 A1 | 4/2004 | Su et al. |
| 2004/0082094 A1 | 4/2004 | Yamamoto |
| 2004/0087441 A1 | 5/2004 | Bock et al. |
| 2004/0094389 A1 | 5/2004 | Boyce |
| 2004/0137661 A1 | 7/2004 | Murayama |
| 2004/0137701 A1 | 7/2004 | Takao |
| 2004/0141536 A1 | 7/2004 | Liu et al. |
| 2004/0159668 A1 | 8/2004 | Vasiadis |
| 2004/0159958 A1 | 8/2004 | Funaki |
| 2004/0178491 A1 | 9/2004 | Akram et al. |
| 2004/0180539 A1 | 9/2004 | Yamamoto et al. |
| 2004/0188260 A1 | 9/2004 | Bonkabeta et al. |
| 2004/0192033 A1 | 9/2004 | Hara |
| 2004/0198033 A1 | 10/2004 | Lee et al. |
| 2004/0198040 A1 | 10/2004 | Geefay et al. |
| 2004/0214373 A1 | 10/2004 | Jiang et al. |
| 2004/0219342 A1 | 11/2004 | Boggs et al. |
| 2004/0219763 A1 | 11/2004 | Kim et al. |
| 2004/0222082 A1 | 11/2004 | Gopalraja et al. |
| 2004/0245649 A1 | 12/2004 | Imaoka |
| 2004/0255258 A1 | 12/2004 | Li |
| 2004/0262753 A1 | 12/2004 | Kashiwazaki |
| 2004/0265562 A1 | 12/2004 | Uzoh et al. |
| 2005/0026443 A1 | 2/2005 | Goo et al. |
| 2005/0037608 A1 | 2/2005 | Andricacos et al. |
| 2005/0046002 A1 | 3/2005 | Lee et al. |
| 2005/0052751 A1 | 3/2005 | Liu et al. |
| 2005/0064707 A1 | 3/2005 | Sinha |
| 2005/0067620 A1 | 3/2005 | Chan et al. |
| 2005/0069782 A1 | 3/2005 | Elenius et al. |
| 2005/0101054 A1 | 5/2005 | Mastromatteo et al. |
| 2005/0101116 A1 | 5/2005 | Tseng |
| 2005/0104228 A1 | 5/2005 | Rigg et al. |
| 2005/0106834 A1 | 5/2005 | Andry et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0136646 A1 | 6/2005 | Larnerd et al. |
| 2005/0139390 A1 | 6/2005 | Kim et al. |
| 2005/0150683 A1 | 7/2005 | Farnworth et al. |
| 2005/0151228 A1 | 7/2005 | Tanida et al. |
| 2005/0164500 A1 | 7/2005 | Lindgren |
| 2005/0189637 A1 | 9/2005 | Okayama et al. |
| 2005/0191861 A1 * | 9/2005 | Verhaverbeke .............. 438/745 |
| 2005/0194169 A1 | 9/2005 | Tonomura |
| 2005/0208766 A1 | 9/2005 | Kirby et al. |
| 2005/0227382 A1 | 10/2005 | Hui |
| 2005/0236708 A1 | 10/2005 | Farnworth et al. |
| 2005/0247894 A1 | 11/2005 | Watkins et al. |
| 2005/0254133 A1 | 11/2005 | Akram et al. |
| 2005/0258530 A1 | 11/2005 | Vindasius et al. |
| 2005/0272221 A1 * | 12/2005 | Yen et al. .................... 438/401 |
| 2005/0277293 A1 | 12/2005 | Kim et al. |
| 2005/0282374 A1 | 12/2005 | Hwang et al. |
| 2006/0003566 A1 | 1/2006 | Emesh |
| 2006/0011809 A1 | 1/2006 | Farnworth et al. |
| 2006/0038272 A1 | 2/2006 | Edwards |
| 2006/0040428 A1 | 2/2006 | Johnson |
| 2006/0043569 A1 | 3/2006 | Benson et al. |
| 2006/0046438 A1 | 3/2006 | Kirby |
| 2006/0046468 A1 | 3/2006 | Akram et al. |
| 2006/0046537 A1 | 3/2006 | Chong et al. |
| 2006/0057776 A1 | 3/2006 | Tao |
| 2006/0057836 A1 | 3/2006 | Nagarajan et al. |
| 2006/0071347 A1 | 4/2006 | Dotta |
| 2006/0151880 A1 | 7/2006 | Tang et al. |
| 2006/0154153 A1 | 7/2006 | Chiang et al. |
| 2006/0160367 A1 | 7/2006 | Wai et al. |
| 2006/0180941 A1 | 8/2006 | Kirby et al. |
| 2006/0186097 A1 | 8/2006 | Watkins et al. |
| 2006/0191882 A1 | 8/2006 | Watkins et al. |
| 2006/0195729 A1 | 8/2006 | Huppenthal et al. |
| 2006/0199363 A1 | 9/2006 | Kirby et al. |
| 2006/0204651 A1 | 9/2006 | Wai et al. |
| 2006/0208360 A1 | 9/2006 | Yiu et al. |
| 2006/0216862 A1 | 9/2006 | Rigg et al. |
| 2006/0223301 A1 | 10/2006 | Vanhaelemeersch et al. |
| 2006/0240687 A1 | 10/2006 | Chong et al. |
| 2006/0249849 A1 | 11/2006 | Cohen |
| 2006/0252254 A1 | 11/2006 | Basol |
| 2006/0252262 A1 | 11/2006 | Kazemi |
| 2006/0255443 A1 | 11/2006 | Hwang et al. |
| 2006/0264041 A1 | 11/2006 | Rigg et al. |
| 2006/0270108 A1 | 11/2006 | Farnworth et al. |
| 2006/0278979 A1 | 12/2006 | Rangel |
| 2006/0278980 A1 | 12/2006 | Trezza et al. |
| 2006/0278988 A1 | 12/2006 | Trezza et al. |
| 2006/0278989 A1 | 12/2006 | Trezza |
| 2006/0281224 A1 | 12/2006 | Edelstein et al. |
| 2006/0281243 A1 | 12/2006 | Trezza |
| 2006/0289967 A1 | 12/2006 | Heck et al. |
| 2006/0292877 A1 | 12/2006 | Lake |
| 2007/0004079 A1 | 1/2007 | Geefay et al. |
| 2007/0012655 A1 | 1/2007 | Kwon et al. |
| 2007/0020805 A1 | 1/2007 | Kim et al. |
| 2007/0020935 A1 | 1/2007 | Taylor et al. |
| 2007/0023121 A1 | 2/2007 | Jones et al. |
| 2007/0032061 A1 | 2/2007 | Farnworth et al. |
| 2007/0035033 A1 | 2/2007 | Ozguz et al. |
| 2007/0037379 A1 | 2/2007 | Enquist et al. |
| 2007/0042598 A1 | 2/2007 | Park |
| 2007/0045120 A1 | 3/2007 | Tiwari et al. |
| 2007/0045388 A1 | 3/2007 | Farnworth et al. |
| 2007/0045779 A1 | 3/2007 | Hiatt |
| 2007/0045806 A1 | 3/2007 | Hsuan |
| 2007/0045812 A1 | 3/2007 | Heng |
| 2007/0045826 A1 | 3/2007 | Lee et al. |
| 2007/0045834 A1 | 3/2007 | Chong et al. |
| 2007/0048896 A1 | 3/2007 | Andry et al. |
| 2007/0048994 A1 | 3/2007 | Tuttle |
| 2007/0049019 A1 | 3/2007 | Wai et al. |

| | | | | | | |
|---|---|---|---|---|---|---|
| 2007/0057028 A1 | 3/2007 | Lake et al. | | JP | 2001077496 | 3/2001 |
| 2007/0077753 A1 | 4/2007 | Iwatake et al. | | JP | 2001082931 A | 3/2001 |
| 2007/0082427 A1 | 4/2007 | Shirahama et al. | | JP | 2001298147 | 10/2001 |
| 2007/0096263 A1 | 5/2007 | Furukawa et al. | | JP | 2002018585 A | 1/2002 |
| 2007/0099395 A1 | 5/2007 | Sridhar et al. | | JP | 2005093980 | 4/2005 |
| 2007/0111386 A1 | 5/2007 | Kim et al. | | JP | 2005310817 | 11/2005 |
| 2007/0122940 A1 | 5/2007 | Gautham | | KR | 20010018694 A | 3/2001 |
| 2007/0138562 A1 | 6/2007 | Trezza | | KR | 20020022122 | 3/2002 |
| 2007/0145563 A1 | 6/2007 | Punzalan et al. | | KR | 20020061812 | 7/2002 |
| 2007/0152342 A1 | 7/2007 | Tsao et al. | | TW | 250597 B | 3/2006 |
| 2007/0155997 A1 | 7/2007 | Li et al. | | WO | WO-90/05424 A1 | 5/1990 |
| 2007/0158839 A1 | 7/2007 | Trezza | | WO | WO-02/075815 A1 | 9/2002 |
| 2007/0158853 A1 | 7/2007 | Sinha | | WO | WO-02/095796 A2 | 11/2002 |
| 2007/0161235 A1 | 7/2007 | Trezza | | WO | WO-2004/054001 A2 | 6/2004 |
| 2007/0166991 A1 | 7/2007 | Sinha | | WO | 2004109770 A2 | 12/2004 |
| 2007/0166997 A1 | 7/2007 | Knorr | | WO | 2005022965 | 3/2005 |
| 2007/0167004 A1 | 7/2007 | Trezza | | WO | 2005036940 | 4/2005 |
| 2007/0170574 A1 | 7/2007 | Lauxtermann et al. | | WO | 2006053036 | 5/2006 |
| 2007/0178694 A1 | 8/2007 | Hiatt | | WO | 2006124597 | 11/2006 |
| 2007/0182020 A1 | 8/2007 | Trezza et al. | | WO | 2007025812 | 3/2007 |
| 2007/0190803 A1 | 8/2007 | Singh et al. | | WO | 2007043718 | 4/2007 |
| 2007/0197013 A1 | 8/2007 | Trezza | | | | |
| 2007/0202617 A1 | 8/2007 | Hembree | | | | |
| 2007/0222050 A1 | 9/2007 | Lee et al. | | | | |
| 2007/0222054 A1 | 9/2007 | Hembree | | | | |
| 2007/0228576 A1 | 10/2007 | Trezza | | | | |
| 2007/0228926 A1 | 10/2007 | Teo et al. | | | | |
| 2007/0262424 A1 | 11/2007 | Hiatt | | | | |
| 2007/0267138 A1 | 11/2007 | White et al. | | | | |
| 2007/0281473 A1 | 12/2007 | Clark et al. | | | | |
| 2007/0293040 A1 | 12/2007 | Emesh et al. | | | | |
| 2008/0006850 A1 | 1/2008 | Ribnicek et al. | | | | |
| 2008/0050904 A1 | 2/2008 | Lake | | | | |
| 2008/0050911 A1 | 2/2008 | Borthakur | | | | |
| 2008/0054444 A1 | 3/2008 | Tuttle | | | | |
| 2008/0057620 A1 | 3/2008 | Pratt | | | | |
| 2008/0079120 A1 | 4/2008 | Foster et al. | | | | |
| 2008/0079121 A1 | 4/2008 | Han | | | | |
| 2008/0081386 A1 | 4/2008 | Raravikar et al. | | | | |
| 2008/0081398 A1 | 4/2008 | Lee et al. | | | | |
| 2008/0265933 A1 | 10/2008 | Tanioka et al. | | | | |
| 2008/0299759 A1 | 12/2008 | Chatterjee et al. | | | | |
| 2008/0299762 A1 | 12/2008 | Mathew et al. | | | | |
| 2008/0318361 A1 | 12/2008 | Han et al. | | | | |
| 2009/0007934 A1 | 1/2009 | Hutto | | | | |
| 2009/0014859 A1 | 1/2009 | Jeung et al. | | | | |
| 2009/0057912 A1 | 3/2009 | Kheng | | | | |
| 2009/0091962 A1 | 4/2009 | Chung et al. | | | | |
| 2009/0127668 A1 | 5/2009 | Choi | | | | |
| 2009/0146312 A1 | 6/2009 | Sulfridge | | | | |
| 2009/0166846 A1 | 7/2009 | Pratt et al. | | | | |
| 2009/0180257 A1 | 7/2009 | Park et al. | | | | |
| 2009/0224405 A1 | 9/2009 | Chiou et al. | | | | |
| 2009/0283898 A1 | 11/2009 | Janzen et al. | | | | |
| 2009/0315154 A1 | 12/2009 | Kirby et al. | | | | |
| 2009/0321947 A1 | 12/2009 | Pratt | | | | |

FOREIGN PATENT DOCUMENTS

| | | |
|---|---|---|
| EP | 0127946 | 12/1984 |
| EP | 0 886 323 | 12/1998 |
| EP | 1 157 967 A2 | 11/2001 |
| EP | 1154474 A1 | 11/2001 |
| EP | 1415950 A2 | 5/2004 |
| FR | 2 835 654 A1 | 8/2003 |
| JP | 59-101882 A | 6/1984 |
| JP | 59191388 | 10/1984 |
| JP | 63052432 | 3/1988 |
| JP | 01252308 A | 10/1989 |
| JP | 02235589 A | 9/1990 |
| JP | 05104316 A | 4/1993 |
| JP | 07-263607 A | 10/1995 |
| JP | 2001-077496 A | 3/2001 |

OTHER PUBLICATIONS

U.S. Appl. No. 10/785,466, Kirby.
U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%20Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

Lee, Rex A. et al., "Laser Created Silicon Vias for Stacking Dies in MCMs," IEEE/CHMT IEMT Symposium, 1991, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-D VLSI," Electronic Components and Technology Conference, 2007, ECTC '07, Proceedings, 57th, May 29, 2007-Jun. 1, 2007, pp. 853-857.

Takahashi, K. et al., "Through Silicon Via and 3-D Wafer/Chip Stacking Technology," 2006 Symposium on VLSI Circuits Digest of Technical Papers.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647.

Trigas, C., "System-In-Package or System-On-Chip?," EE Times, Sep. 19, 2003, <http://www.eetimes.com/story/OEG20030919S0049>.

XSiL, xise200 for vias and micro-machining, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

Amazawa, T. et al., "Planarized Multilevel Interconnection Using Chemical Mechanical Polishing of Selective CVD-AI Via Plugs," IEEE Transactions on Electron Devices, vol. 45, No. 4, pp. 815-820, Apr. 1998.

Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>.

De Boer, M.J. et al., "Micromachining of Buried Micro Channels in Silicon," Journal of Microelectromechanical Systems, vol. 9, No. 1, Mar. 2000, IEEE, ISSN: 1057-7157.

Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.

Jang, D.M. et al., "Development and Evaluation of 3-D SiP with Vertically Interconnected Through Silicon Vias (TSV)," Proceedings of the 57th Electronic Components and Technology Conference, IEEE, May 29, 2007-Jun. 1, 2007, pp. 847-852, ISBN: 1-4244-0985-3.

Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000.

Keigler, A. et al., "Enabling 3-D Design," Semiconductor International, Aug. 2007.

Kim, J.Y. et al., "S-RCAT(Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Kuhn, Markus and Jose A. Rodriguez, "Adsorption of sulfur on bimetallic surfaces: Formation of copper sulfides on Pt (111) and Ru(001)," J. Vac. Sci. Technol. A 13(3), pp. 1569-1573, May/Jun. 1995.

Kurita, Y. et al., "A 3D Stacked Memory Integrated on a Logic Device Using SMAFTI Technology," 2007 IEEE Electronic Components and Technology Conference, pp. 821-829, May 29,-Jun. 1, 2007, ISBN 1-4244-0985-3.

Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.

Moffat, T.P., et al. "Superconformal film growth; Mechanism and quantification," IBM J. Res. & Dev., vol. 49, No. 1, pp. 19-36, Jan. 2005.

Morrow, P.R. et al., "Three-Dimensional Wafer Stacking Via Cu-Cu Bonding Integrated With 65-nm Strained-Si/ Low-k CMOS Technology," IEEE Electron Device Letters, vol. 27, No. 5, pp. 335-337, May 2006, ISBN: 0741-3106.

Pienimaa, S.K. et al., "Stacked Thin Dice Package," Proceedings of the 51st Electronic Components and Technology Conference, 2001, pp. 361-366, IEEE.

Solberg, V., "Innovative 3-D Solutions for Multiple Die Packaging," SMTA International Conference, Sep. 21, 2003.

Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.

Thomas, D.J. et al., "Etching of Vias and Trenches Through Low k Dielectrics with Feature Sizes Down to 0.1 mm Using MORIO High Density Plasmas," presented at the 197th Meeting of the Electrochemical Society, Toronto 2000, <http://www.trikon.com/pdfs/ECS2b.pdf>.

Vereecken, P.M. et al., "The chemistry of additives in damascene copper plating," IBM J. Res. & Dev., vol. 49, No. 1, pp. 3-18, Jan. 2005.

* cited by examiner

CONDUCTIVE INTERCONNECT STRUCTURES AND FORMATION METHODS USING SUPERCRITICAL FLUIDS

TECHNICAL FIELD

The present invention is directed generally toward conductive interconnect structures and formation methods using supercritical fluids.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid-state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect their delicate components and to provide external electrical contacts.

FIG. 1A is a partially schematic illustration of an imaging device 10 configured in accordance with the prior art. The imaging device 10 includes a die 20 having an integrated circuit 21 coupled to an image sensor 12. A color filter array (CFA) 13 is formed over the active pixels of the image sensor 12. The CFA 13 has individual filters or filter elements configured to allow the wavelengths of light corresponding to selected colors (e.g., red, green, or blue) to pass to each pixel of the image sensor 12. A plurality of microlenses 14 form a microlens array 15 that is positioned over the CFA 13. The microlenses 14 are used to focus light onto the initial charge accumulation regions of the image sensor pixels. A glass cover 16 is positioned to protect the microlens array 15 and other features of the die 20 from contamination. A device lens 17 is positioned a selected distance from the microlens array 15 to focus light onto the microlens array 15 and ultimately onto the image sensor 112.

The integrated circuit 21 of the die 20 can be electrically coupled to external devices via solder balls 11. The solder balls 11 are located on the side of the die 20 opposite from the image sensor 12 so as to avoid interference with the operation of the image sensor 12. Accordingly, the die 20 can include multiple through-wafer interconnects (TWIs) connected between the solder balls 11 and the bond pads 22, which are in turn connected to the integrated circuit 21. Each TWI can include a via that extends through the die 20, and an electrically conductive interconnect structure 30 located in the via.

FIG. 1B is an enlarged, cross-sectional view of an interconnect structure 30 configured in accordance with the prior art. The interconnect structure 30 includes a via 50 that extends through the bond pad 22 and through the die 20. A dielectric layer 31 electrically isolates the via 50 from other structures in the die 20, and a barrier layer 33 is positioned against the dielectric layer 31 to prevent migration of conductive materials away from the interconnect structure 30. A seed layer 34 and one or more conductive layers 37 (two are shown in FIG. 1B) are disposed on the barrier layer 33. These conductive layers can include materials such as copper and/or nickel. Nickel can be used as a second conductive layer to provide a barrier between a copper conductive layer and a volume of fill material 40. The fill material 40 typically includes solder.

One characteristic of the interconnect structure 30 is that the conductive layers 37 can have an uneven thickness. This is particularly so for interconnect structures having high aspect ratios (e.g., greater than 1:1). One drawback with this feature is that it may cause discontinuities in the electrical path between the bond pad 22 and the solder ball 11. Accordingly, the interconnect structure 30 may not always provide a reliable electrical connection between these two structures.

Another characteristic of the interconnect structure 30 is that the fill material 40 typically includes solder. The solder will only wet to a metal surface, and it will consume some of that surface during the wetting process. If the conductive layers 37 are nonexistent or so thin that they become consumed at the bottom of the via, then the solder fill material 40 may lose its adhesion to the sidewall in this region of the via. This in turn may result in a failure of the electrical path between the bond pad 22 and the solder ball 11.

DETAILED DESCRIPTION

A. Overview/Summary

Figure 1A:
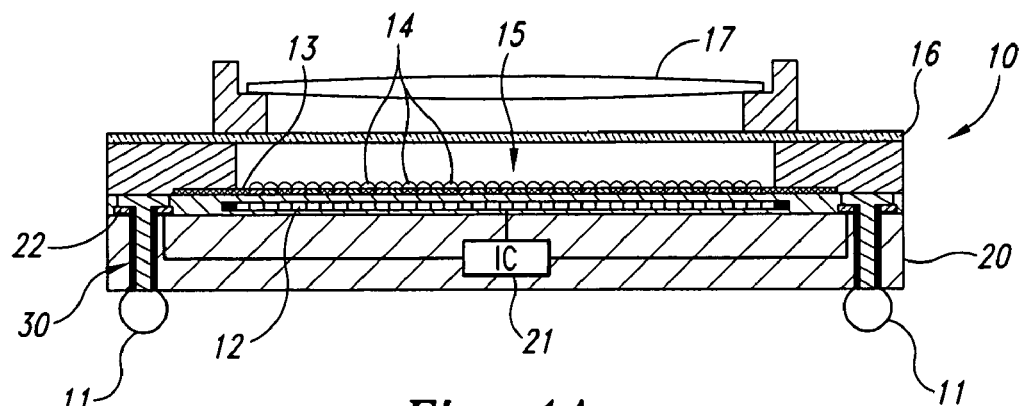
FIGS. 1A-1B illustrate an imaging device formed by a process in accordance with the prior art.

The following disclosure describes several embodiments of methods for forming through-wafer interconnects, and devices formed using such techniques. One such device includes a microfeature workpiece or substrate having a via with generally non-conductive wall portions. The wall portions are spaced apart by a width of the via, and the via has a length (generally transverse to the width) of at least 100 microns or more. A conductive material is disposed in the via and the conductive material has a generally uniform grain structure across the width of the via. In particular embodiments, the conductive material is disposed in the via without a seed layer located in the via.

A method for forming a microelectronic device in accordance with another embodiment of the invention includes forming a via in the microelectronic device, with the via having a width and a length generally transverse to the width. The length can be approximately 100 microns or more. The method can further include disposing a conductive material in the via while the via is exposed to a supercritical fluid. For example, the method can include combining a metal-containing precursor with a supercritical carbon dioxide solvent. The conductive material can be disposed in such a manner as to have a generally uniform thickness over the length of the via in a direction transverse to a sidewall of the via.

A method in accordance with still another aspect of the invention can include forming a via in a substrate and disposing an organic material (e.g., a photoresist material) on a surface of the substrate and in the via. The method can further include removing at least a portion of the organic material by exposing the substrate to a supercritical fluid. The method can further include disposing a conductive material in the via while the via is exposed to the supercritical fluid. In particular embodiments, disposing the conductive material can include introducing a conductive material precursor into the supercritical fluid, reducing the conductive material precursor by introducing an additional chemical specie or elevating a temperature of the supercritical fluid, or both, and causing the conductive material to precipitate from the supercritical fluid and occupy space in the via.

Specific details of several embodiments of the invention are described below with reference to CMOS image sensors to provide a thorough understanding of these embodiments, but other embodiments can use CCD image sensors or other types of solid-state imaging devices. In other embodiments, the invention can be practiced in connection with devices that do not include image sensors. Several details describing structures or processes that are well-known and often associated with other types of microelectronic devices are not set forth in the following description for purposes of brevity. Moreover, although the following disclosure sets forth several embodiments of different aspects of the invention, several other embodiments of the invention can have different configurations or different components than those described in this section. As such, the invention may have other embodiments with additional elements or without several of the elements described below with reference to FIGS. 2-6.

B. Methods for Forming Interconnect Vias and Conductive Structures

Figure 2:
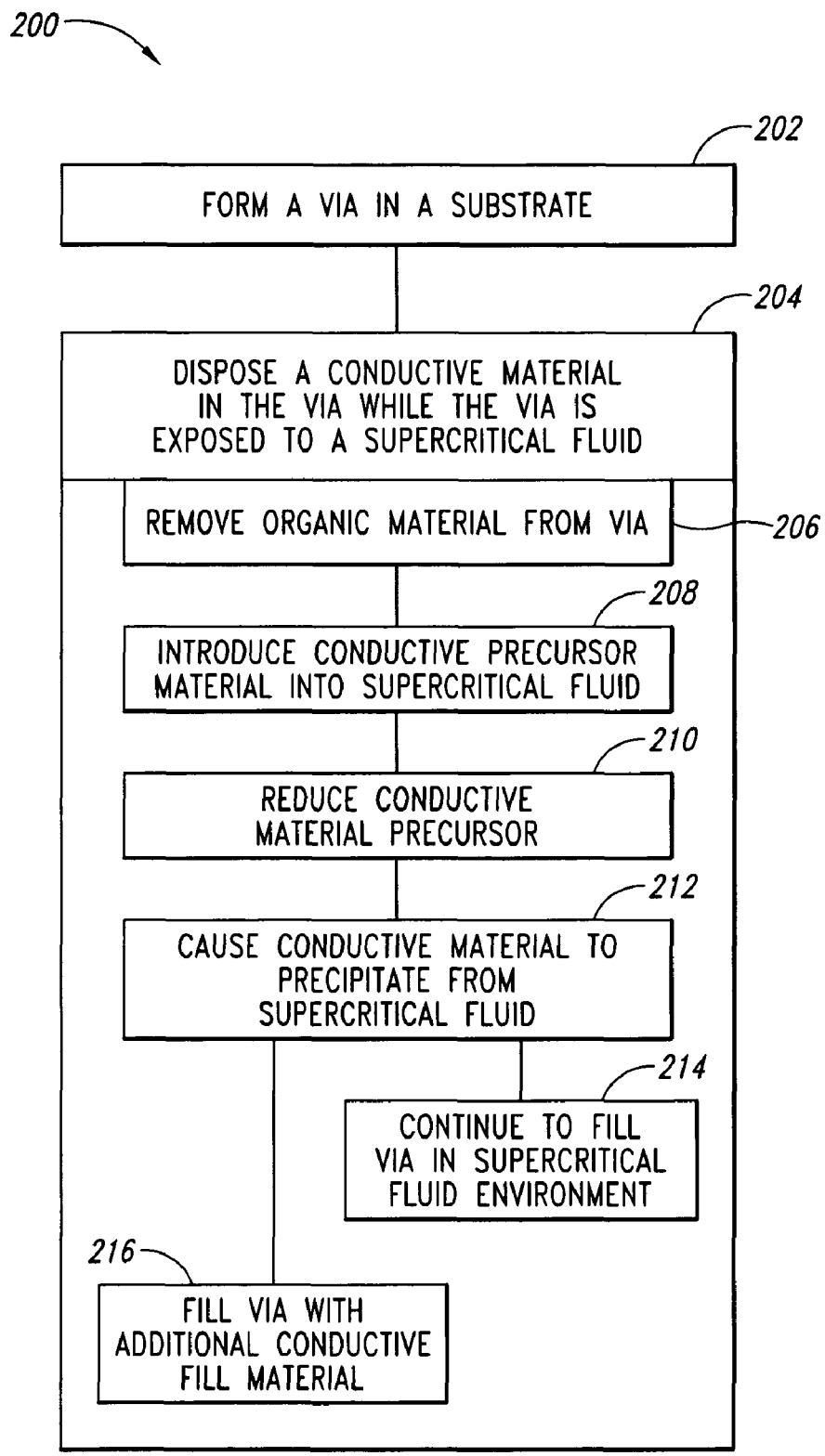
FIG. 2 is a flow diagram, illustrating a process for forming interconnect structures in accordance with several embodiments of the invention.

FIG. 2 is a flow diagram illustrating a process 200 for forming an interconnect structure in a microelectronic device. The process 200 can include forming a via in a substrate (process portion 202) and then disposing a conductive material in the via while the via is exposed to a supercritical fluid (process portion 204). Disposing the conductive material in the via can include one or more of several additional steps, identified in FIG. 2 as process portions 206-216. For example, the process 200 can include removing an organic material (process portion 206) before disposing the conductive material in the via. The organic material can include a residual photoresist material that remains after a prior masking process. The process 200 can further include introducing a conductive material precursor into the supercritical fluid (process portion 208) and chemically reducing the conductive material precursor (process portion 210). The process 200 can further include causing the conductive material to precipitate (process portion 212) into the via. The process of filling the via can then continue with the same conductive material precursor and in a supercritical fluid environment (process portion 214). In other embodiments, the via can be filled with additional conductive materials (process portion 216), either in a supercritical fluid environment or in an environment that does not include a supercritical fluid. Further details of the foregoing process steps and representative structures formed by executing those steps are described below with reference to FIGS. 3-6.

FIGS. 3A-3E illustrate a process for forming a via. Further details of this process are also provided in pending U.S. application Ser. No. 11/169,546, filed Jun. 28, 2005, entitled "Interconnect Vias and Associated Methods of Formation" and incorporated herein by reference. FIGS. 4A-4K illustrate a process for forming a conductive interconnect structure in the via. As will be discussed in greater detail later with reference to FIGS. 4A-4K, aspects of the process may be conducted in a supercritical fluid environment. The structures formed using such techniques may be more structurally uniform and therefore may provide better and more reliable electrical conduction paths than existing structures.

Figure 3A:
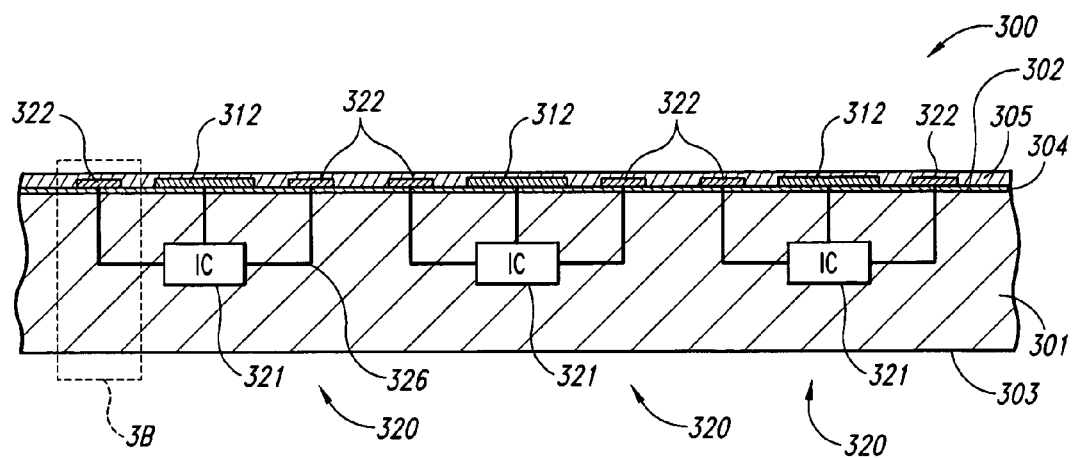
FIG. 3A is a partially schematic, cross-sectional illustration of a substrate prior to having an interconnect structure formed in accordance with an embodiment of the invention.

FIG. 3A is a side cross-sectional view of a portion of an imager workpiece 300 at an initial stage before the interconnect structures have been formed. The workpiece 300 can include a substrate 301 with a plurality of imaging dies 320 formed in and/or on the substrate 301. The substrate 301 has a first side or surface 302 and a second side or surface 303. The substrate 301 is generally a semiconductor wafer, and the imaging dies 320 are arranged in a die pattern on the wafer. Individual dies 320 can include integrated circuitry 321, a plurality of terminals or bond sites 322 (e.g., bond-pads) electrically coupled to the integrated circuitry 321 with conductive paths 326, and an image sensor 312. The image sensor 312 can be a CMOS image sensor or a CCD image sensor for capturing pictures or other images in the visible spectrum. In other embodiments, the image sensor 312 can detect radiation in other spectrums (e.g., IR or UV ranges). The bond sites 322 shown in FIG. 3A are external features at the first side 302 of the substrate 301. In other embodiments, however, the bond sites 322 can be internal features that are embedded at an intermediate depth within the substrate 301.

Figure 3B:
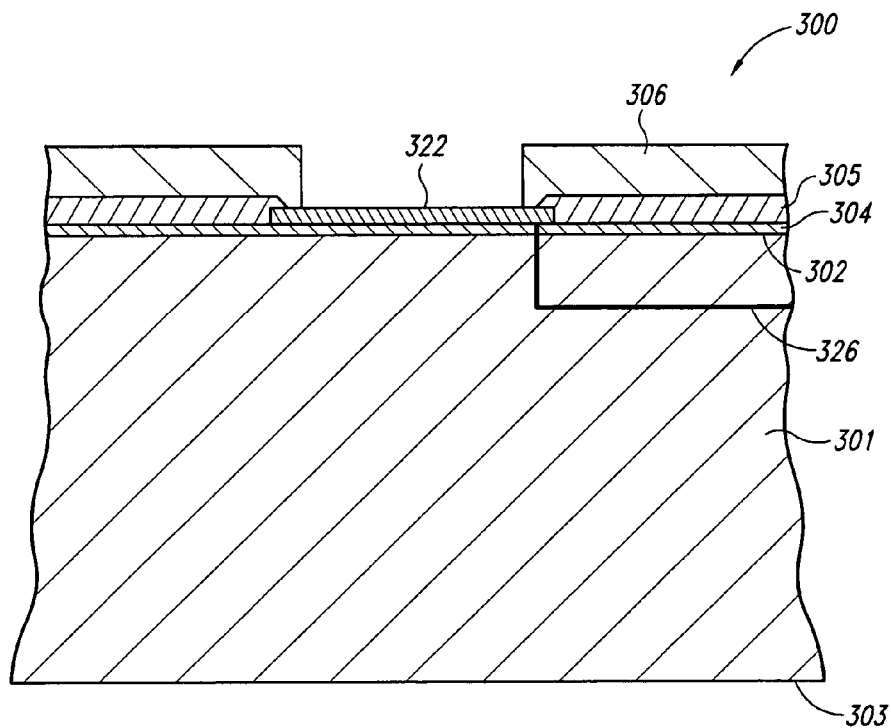
FIGS. 3B-3E illustrate a process for forming a via suitable for receiving conductive material in accordance with an embodiment of the invention.

FIG. 3B is a side cross-sectional view of the area 3B shown in FIG. 3A. In previous processing steps, a first dielectric layer 304 was applied to the first side 302 of the substrate 301, and a second dielectric layer 305 was applied over the first dielectric layer 304. The second dielectric layer 305 was then patterned and etched to expose the bond site 322. The dielectric layers 304 and 305 can be formed from a polyimide material or other nonconductive materials. For example, the first dielectric layer 304 and/or one or more of the subsequent dielectric layers can include parylene, a low temperature chemical vapor deposition (CVD) material such as tetraethylorthosilicate (TEOS), silicon nitride ($Si_3N_4$), silicon oxide ($SiO_2$), and/or other suitable materials. The foregoing list of dielectric materials is not exhaustive. The dielectric layers 304 and 305 may be but need not be composed of the same material. One or both of the layers 304 and 305 may be omitted and/or additional layers may be included in other embodiments.

After depositing the second dielectric layer 305, a mask 306 is applied over the second dielectric layer 305 and patterned as shown in FIG. 3B. The mask 306 can be a layer of resist that is patterned according to the arrangement of bond sites 322 on the substrate 301. Accordingly, the mask 306 can have an opening over each bond site 322.

Figure 3C:
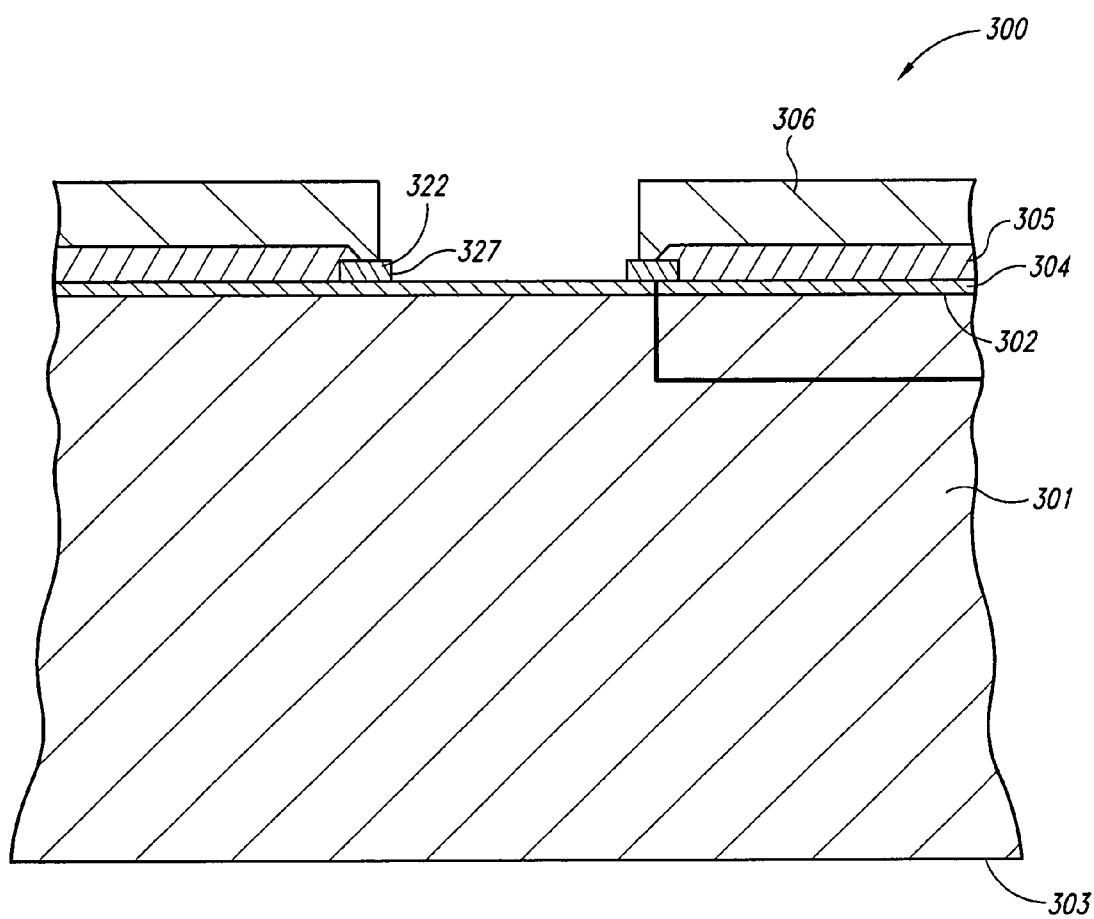

As shown in FIG. 3C, a hole or aperture 327 has been formed through the bond site 322. The hole 327 can be formed using a wet etching process that selectively removes material from the bond site 322 but not the first dielectric layer 304. The first dielectric layer 304 can accordingly act as an etch-stop. In embodiments where the bond site 322 includes more than one type of metal, the etching process can be repeated until the hole 327 extends through the bond site 322.

Figure 3D:
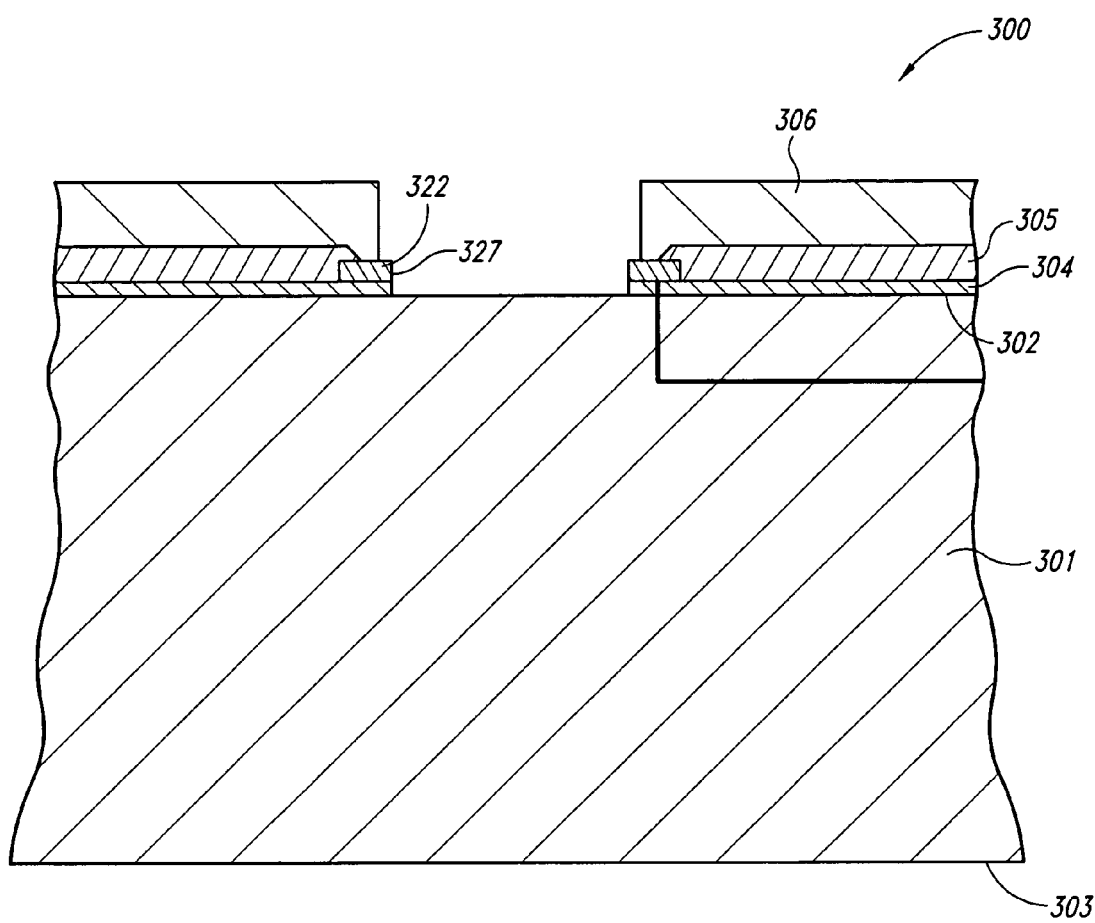

Referring to FIG. 3D, the first dielectric layer 304 directly beneath the bond site 322 is etched to expose at least a portion of the substrate 301. The etching process for the first dielectric layer 304 can be different than the etching process for the bond site 322 to account for the different compositions of these structures. For example, the dielectric etching process can selectively remove material from the first dielectric layer 304 at a higher etch rate than from either the bond site 322 or the substrate 301. The dielectric etching process accordingly does not significantly alter the general structure of the bond site 322 or the substrate 301. In an alternative embodiment, the hole 327 can be etched through both the bond site 322 and the first dielectric layer 304 using a single etching process.

Figure 3E:
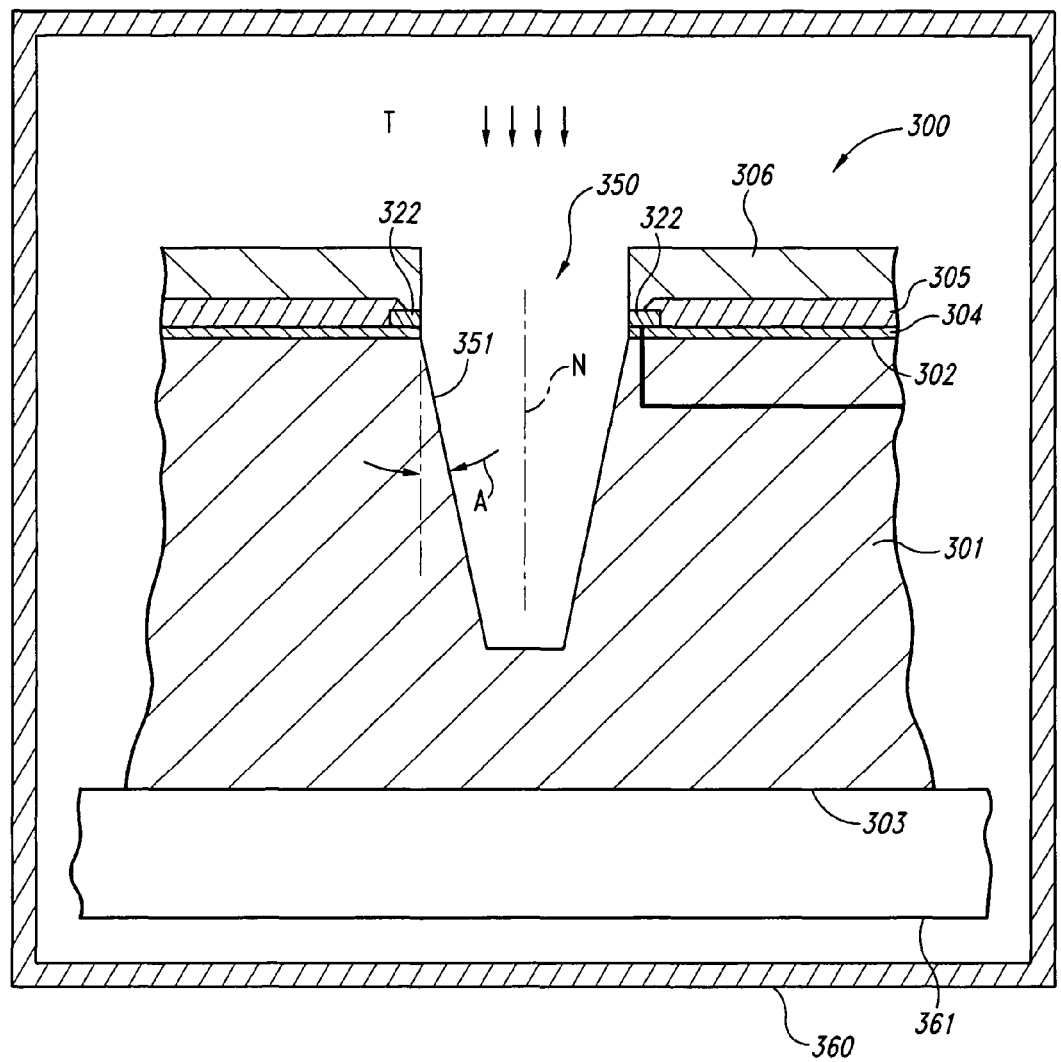

FIG. 3E illustrates a process for forming a via 350 in the substrate 301. The substrate 301 can be positioned in a plasma chamber 360 (shown schematically in FIG. 3E), where it can be supported on a cold chuck 361. The cold chuck 361 can control a temperature T in the chamber 360 and, more specifically, the temperature of, or at least proximate to, the substrate 301. The via 350 can then be formed in the substrate 301 using a plasma process, e.g., a deep reactive ion etching process. In a particular embodiment, the temperature T within the chamber 360 is controlled to cryogenic temperatures. For example, the temperature T can be controlled to be from about 100° C. to about 130° C. (173K to 143K). In other embodiments, the temperature T may be controlled to other levels, for example, levels at or above 71K (the temperature at which nitrogen liquifies).

The size and shape of the via 350 can vary depending on the particular application. For example, the via 350 can have an aspect ratio of about 1:1 or greater in some embodiments. The via 350 can extend by a distance of at least 150 microns from the first surface 302. In any of the foregoing embodiments, the orientation of a sidewall 351 of the via 350 can be controlled by controlling one or more process parameters (e.g., substrate temperature, ion type and concentration and/or others). For example, the overall shape of the via 350 can be tapered so that the sidewalls 351 form an angle A with respect to the normal axis N. The value of angle A can be from about 0° to about 5°, and in a particular embodiment, about 3°. The value of the angle A is exaggerated in FIG. 3E for purposes of illustration.

Figure 4A:
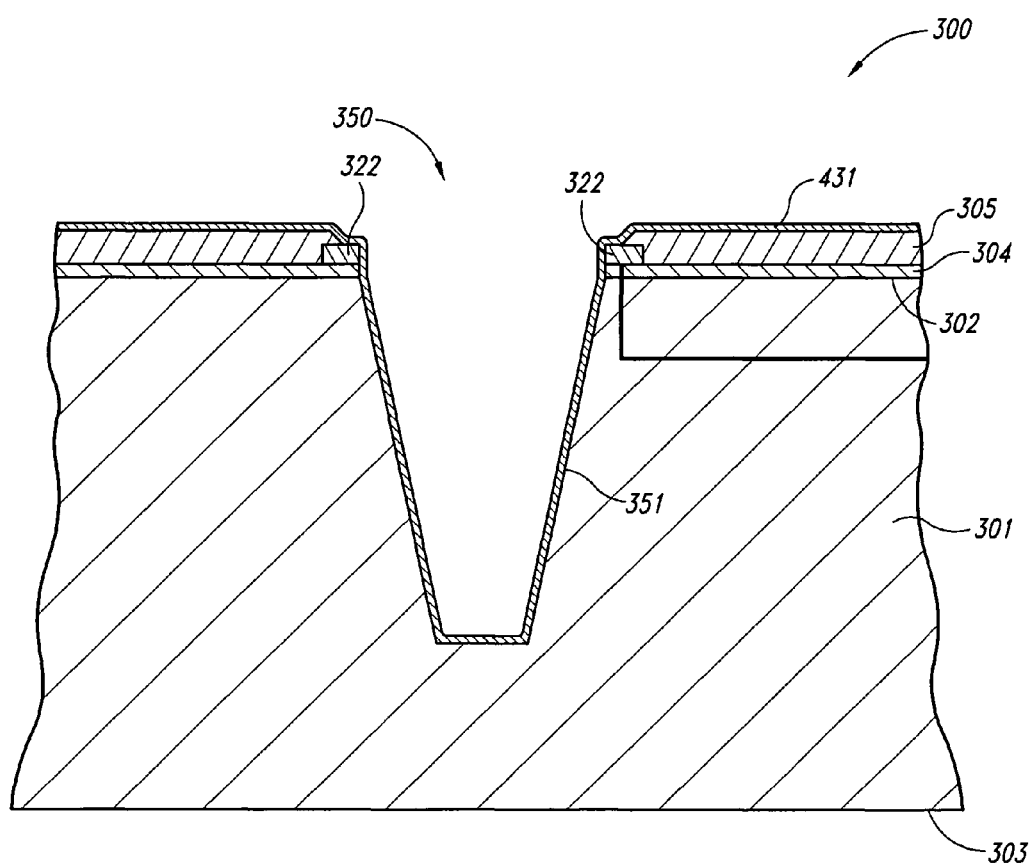
FIGS. 4A-4K illustrate a process for disposing a conductive material in the via in accordance with an embodiment of the invention.
Figure 4B:
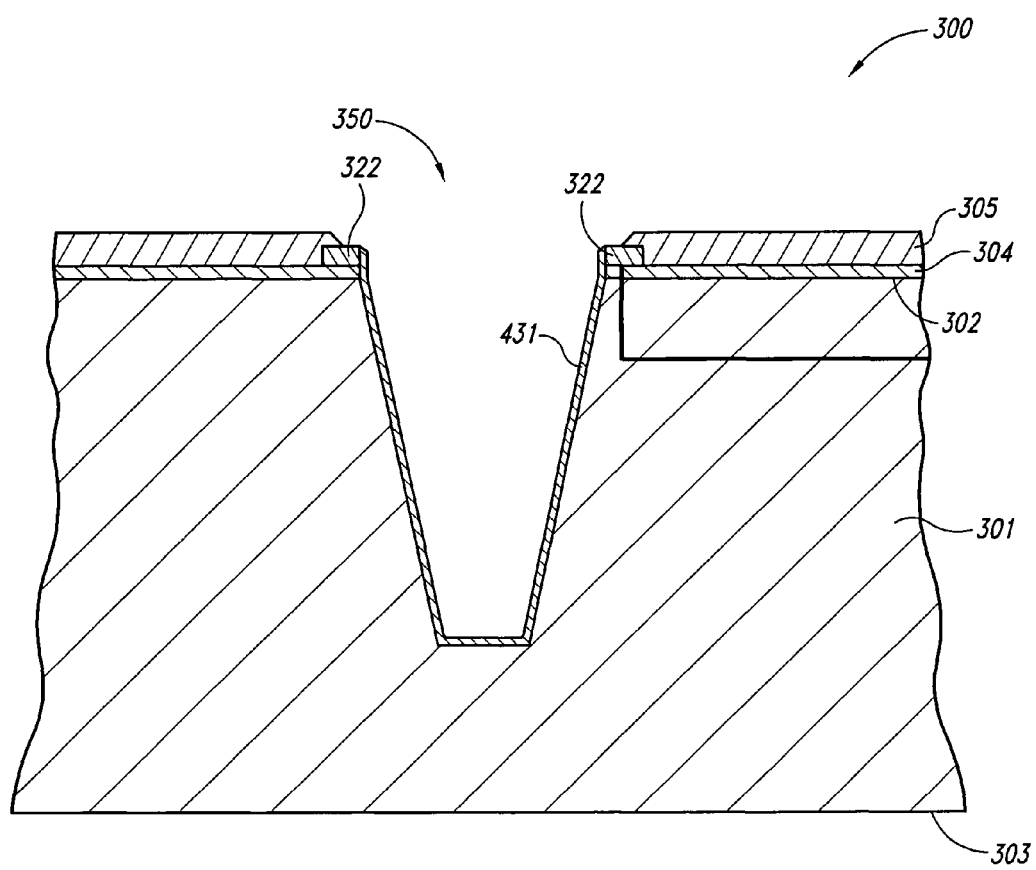

Referring next to FIG. 4A, a third dielectric layer 431 is deposited onto the workpiece 300 to line the sidewalls 351 of the via 350 within the substrate 301. The third dielectric layer 431 electrically insulates components in the substrate 301 from an interconnect that is subsequently formed in the via 350, as described in greater detail below. In one embodiment, the third dielectric layer 431 can be an aluminum-rich oxide material applied using a pulsed layer deposition process or another suitable low temperature CVD oxide. In another embodiment, the third dielectric layer 431 can include a silane-based oxide material, e.g., a low silane oxide. A low silane oxide process can be particularly suitable when the sidewall angle of the via 350 is greater than zero degrees. This process is compatible with the low temperature at which the via 350 is formed. In still further embodiments, the third dielectric layer 431 can include other suitable dielectric materials. Referring to FIG. 4B, a suitable etching process (e.g., a spacer etch) is used to remove the third dielectric layer 431 from at least a portion of the bond site 322.

Figure 4C:
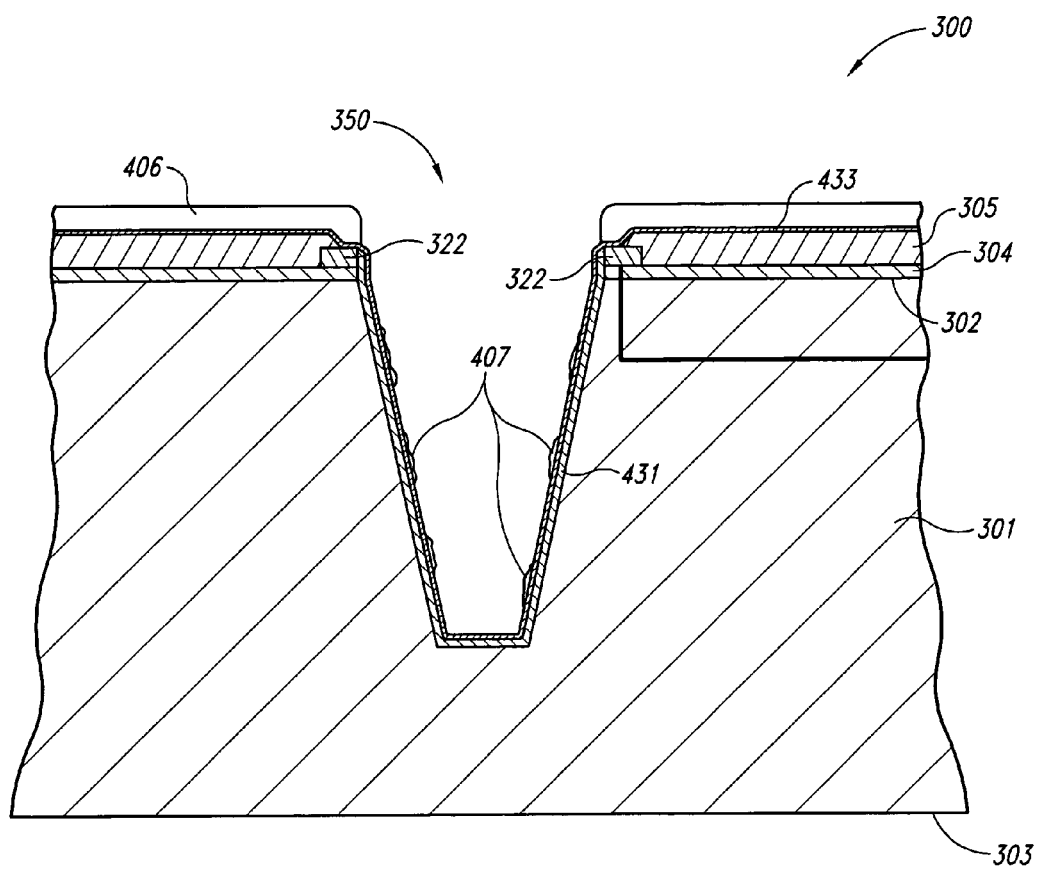

Referring to FIG. 4C, a barrier layer 433 is then deposited onto the workpiece 300 over the third dielectric layer 431 so as to be in electrical contact with the bond site 322. The barrier layer 433 generally covers the second dielectric layer 305 and the bond site 322 in addition to the third dielectric layer 431. In one embodiment, for example, the barrier layer 433 is a layer of tantalum that is deposited onto the workpiece 300 using physical vapor deposition (PVD). The thickness of the barrier layer 433 is about 150 angstroms. In other embodiments, the barrier layer 433 may be deposited onto the workpiece 300 using other vapor deposition processes, such as CVD, and/or may have a different thickness. The composition of the barrier layer 433 is not limited to tantalum, but rather may be composed of tungsten or other suitable materials.

In at least some embodiments, a resist layer 406 can be applied to the workpiece 300 prior to adding conductive materials to the via 350. The resist layer 406 can protect surrounding structures from deposition of such conductive materials, and can be removed from the surfaces of the via 350 itself. In some cases, residual resist 407 can remain in the via 350, in particular, on the surfaces of the barrier layer 433. As discussed below, this residual resist material 407 can be removed as part of the process for filling the via 350 with conductive material.

Figure 4D:
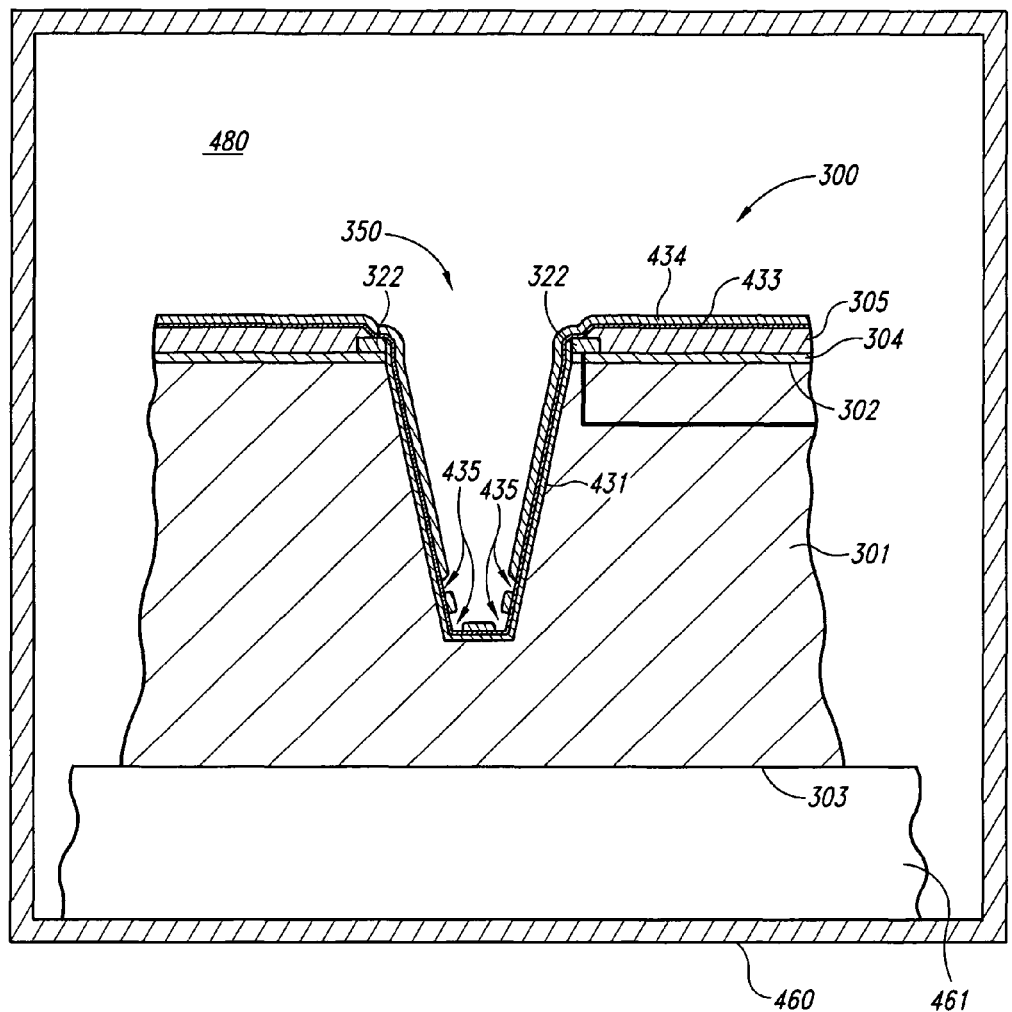

Referring next to FIG. 4D, the workpiece 300 can be placed in a chamber 460 suitable for supporting a supercritical fluid 480. As used herein, the term supercritical fluid refers to a substance that is above its critical temperature and critical pressure, e.g., beyond a point where the distinction between liquid phase and gas phase exists. The supercritical fluid 480 can accordingly fill the via 350. In one aspect of this embodiment, the supercritical fluid 480 can act to remove any residual photoresist material 407 (FIG. 4C) or other organic material that may be contaminating surfaces of the via 350. In a particular embodiment, the supercritical fluid 480 can include carbon dioxide, and in other embodiments, the supercritical fluid 480 can include other constituents e.g., other non-polar solvents.

Once the supercritical fluid 480 is introduced into the chamber 460, a precursor gas containing conductive material can also be introduced into the chamber 460. For example, when copper is deposited in the via 350, the precursor gas can include $Cu(tmhd)_2$. In other embodiments, for example, when materials other than copper are disposed in the via 350, the precursor gas can include other constituents. In any of these embodiments, the conductive material can undergo a reduction reaction and can precipitate from the supercritical fluid 480 after an appropriate triggering event has been initiated. Such an event can include the introduction of an additional chemical specie, (e.g., a catalyst) or elevating the temperature of the supercritical fluid 480, or both. In particular examples, copper can be precipitated into the via by introducing hydrogen in the chamber 460 in the presence of $Cu(tmhd)_2$ and elevating the temperature of the workpiece 300. The temperature to which the workpiece is elevated can be about 200° C. or higher, depending on factors that include whether the copper is precipitated onto an existing seed layer or directly onto the barrier layer 433. The workpiece 300 can be heated above the ambient temperature in the chamber 460 via a heated chuck 461. The pressure within the chamber 460 can also be elevated, for example, to pressures up to or in excess of 200 atm. Further details of suitable constituents and process parameters are known in a general sense in the relevant art, for example, in an article by Blackburn et al. titled "Deposition of Conformal Copper and Nickel Films From Supercritical Carbon Dioxide" (*Science*, vol. 294, 5 Oct. 2001), incorporated herein in its entirety by reference.

Figure 4E:
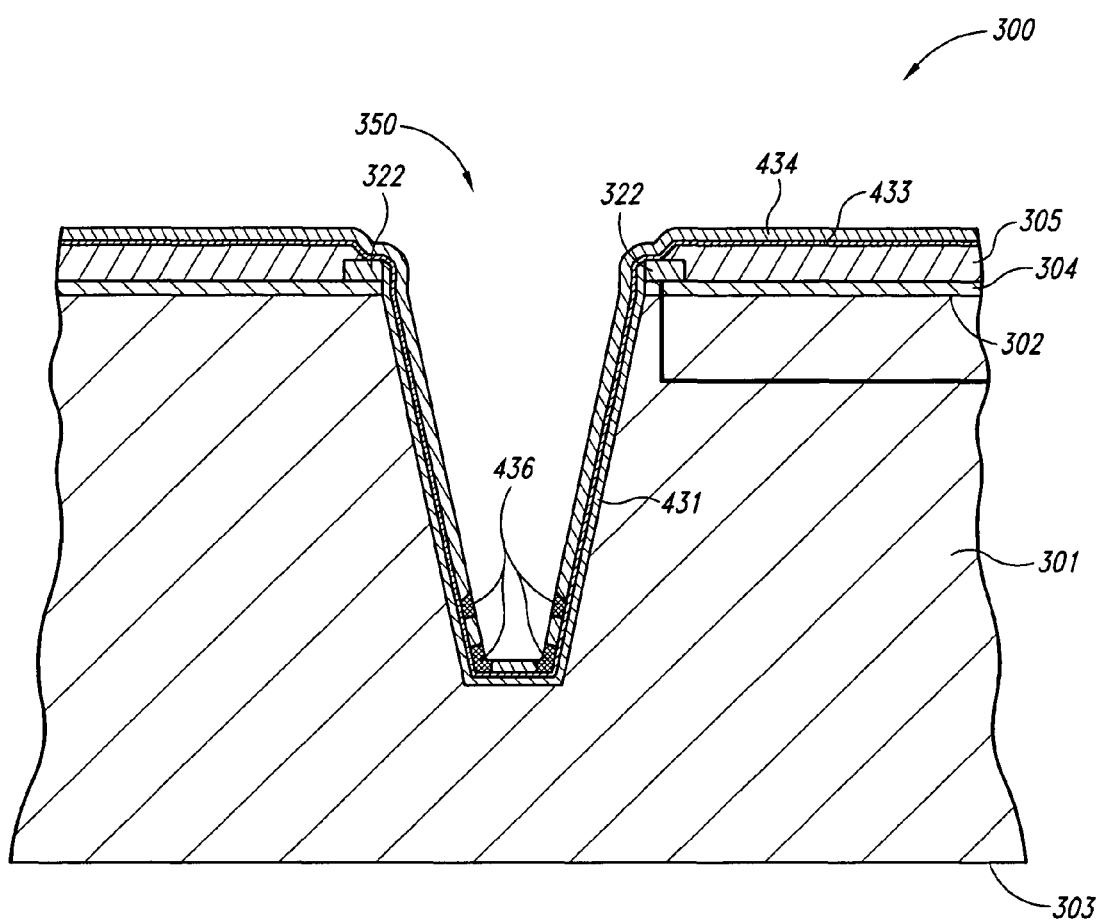

As noted above, the foregoing technique can be used to dispose a seed layer 434 on the barrier layer 433 in the via 350. The seed layer 434 can be composed of copper or other suitable materials. The thickness of the seed layer 434 may be about 2000 angstroms, but could be more or less depending upon the depth and aspect ratio of the via 350. It is expected that forming the seed layer 434 in a supercritical fluid environment will cause the seed layer to form uniformly over the barrier layer 433. However, in some cases (e.g., when techniques other than supercritical fluid deposition are used to form the seed layer 434), the seed layer 434 may not uniformly cover the barrier layer 433, and the seed layer 434 may have voids 435 within the via 350. This can cause non-uniform electroplating in the via 350 and across the workpiece 300. When the seed layer 434 is deficient, it is preferably enhanced using a process that fills voids or noncontinuous regions of the seed layer 434 to form a more uniform seed layer. Referring to FIG. 4E, for example, voids 435 and/or noncontinuous regions of the seed layer 434 have been filled with additional material 436, such as copper or another suitable material. One suitable seed layer enhancement process is described in U.S. Pat. No. 6,197,181, which is incorporated by reference.

Figure 4F:
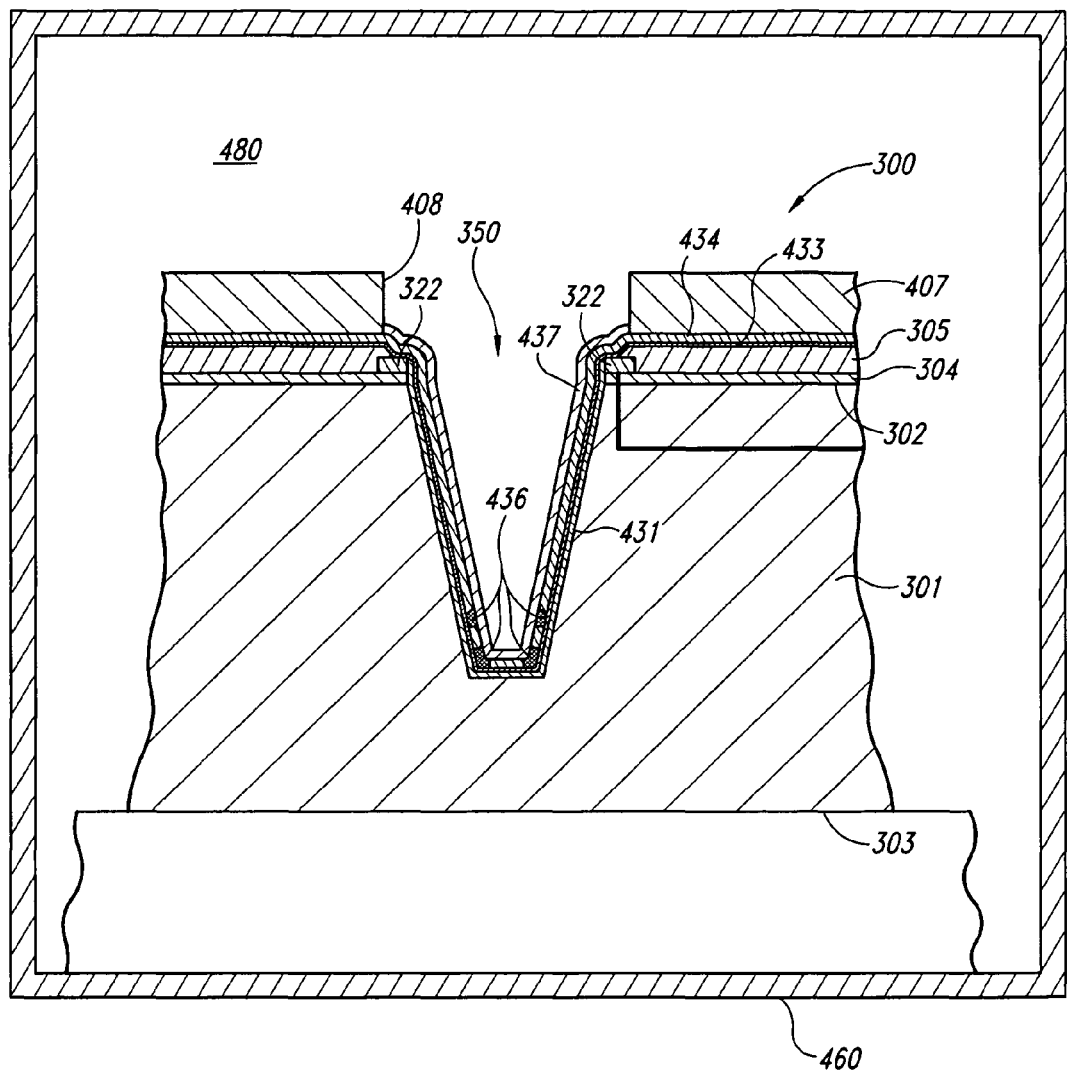

Referring next to FIG. 4F, a resist layer 407 is deposited onto the seed layer 434 and patterned to have an opening 408 over the bond site 322 and corresponding via 350. A first conductive layer 437 is then deposited onto the exposed portions of the seed layer 434 in the via 350. The first conductive layer 437 can include copper that is deposited onto the seed layer 434 in a supercritical fluid environment, in a manner generally similar to that described above. In the illustrated embodiment, the thickness of the first conductive layer 437 is about 1 micron. In other embodiments, the first conductive layer 437 may include other suitable materials and/or have a different thickness.

Figure 4G:
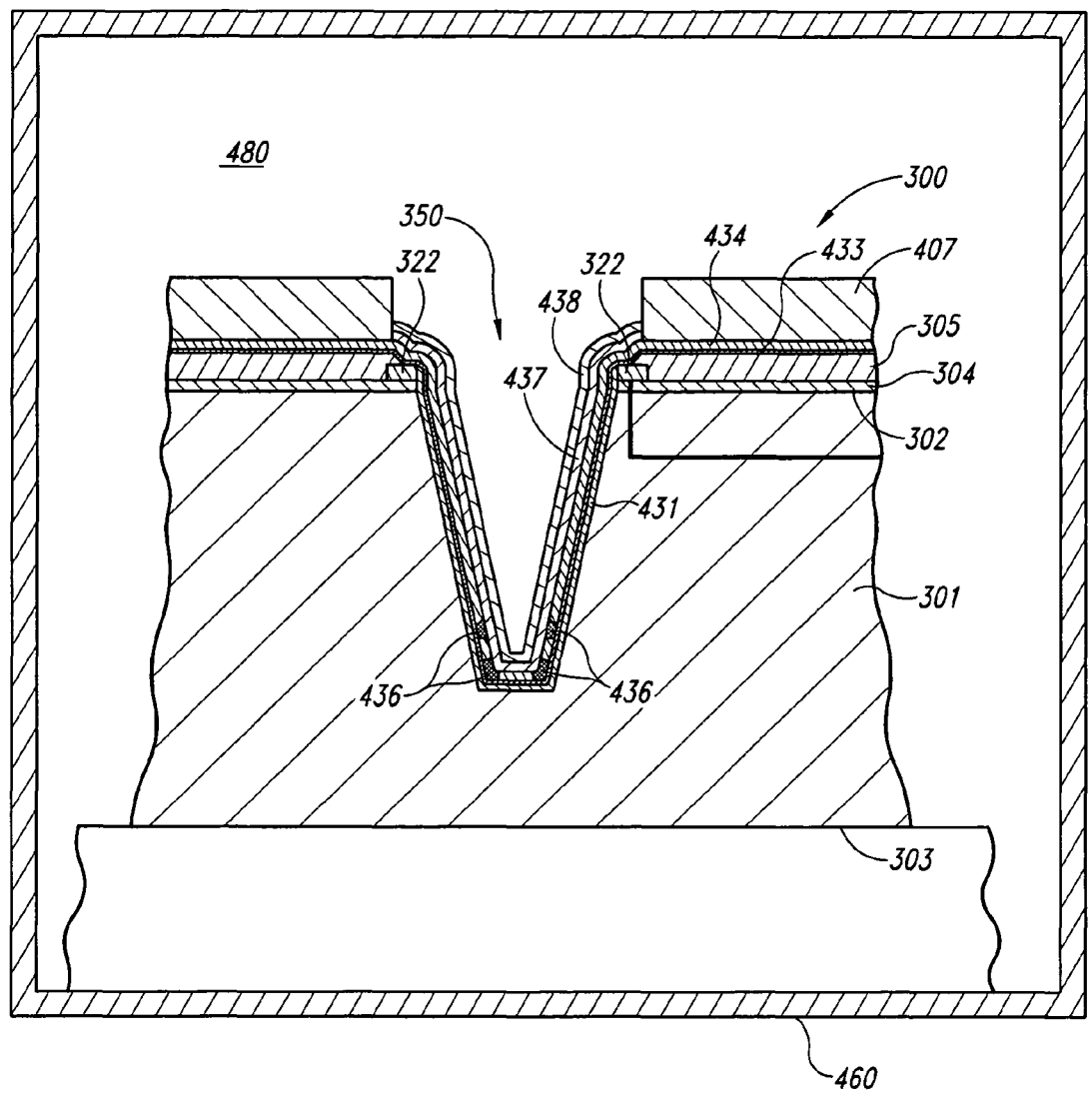

Referring to FIG. 4G, a second conductive layer 438 is deposited onto the first conductive layer 437 in the via 350. The second conductive layer 438 can include a wetting agent that facilitates depositing subsequent materials into the via 350. For example, the second conductive layer 438 can include nickel that is deposited onto the first conductive layer 437 in a supercritical fluid environment, generally similar to that described above. In such cases, a suitable nickel-continuing pre-cursor (e.g., $NiCp_2$) can be introduced into a supercritical $CO_2$ environment at suitable temperatures and pressures (e.g., 60° C. and 200 atm), and reduced with hydrogen. In the illustrated embodiment, the thickness of the second conductive layer 438 is approximately 3-5 microns. In other embodiments, the via 350 may be coated with other suitable materials using other methods, and/or the second conductive layer 438 can have a different thickness.

Figure 4H:
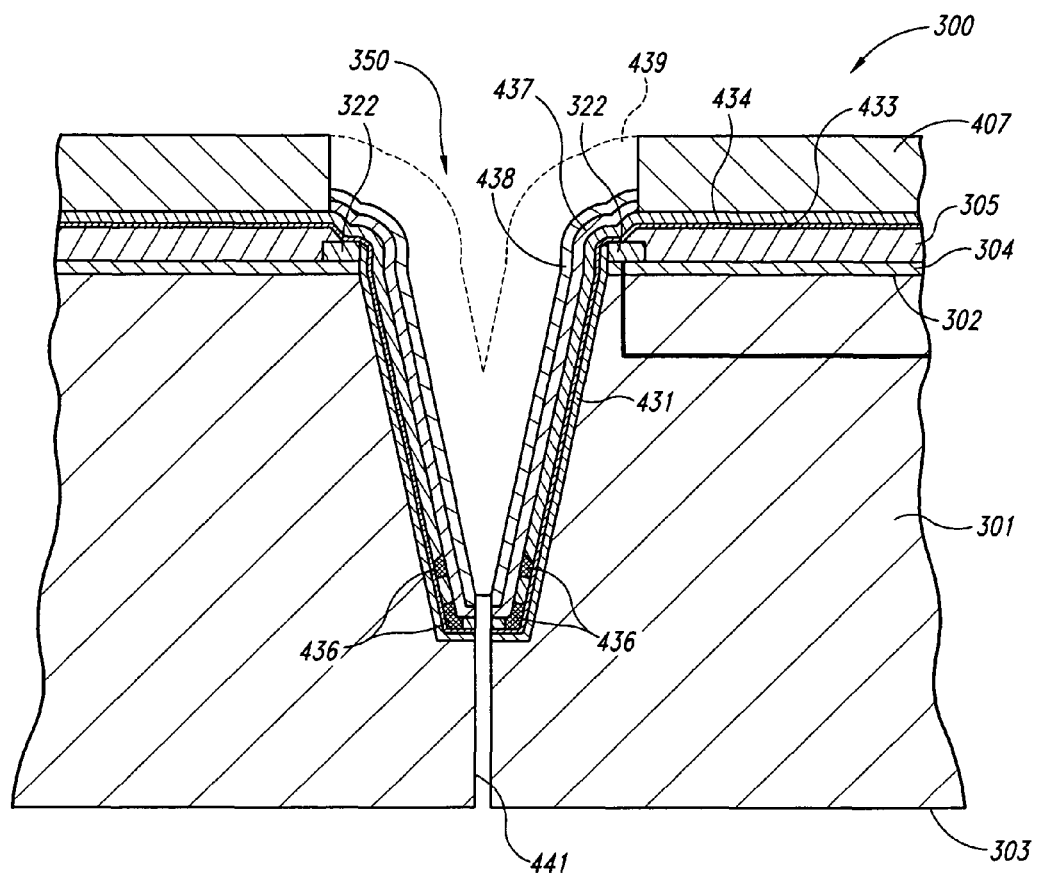
Figure 4I:
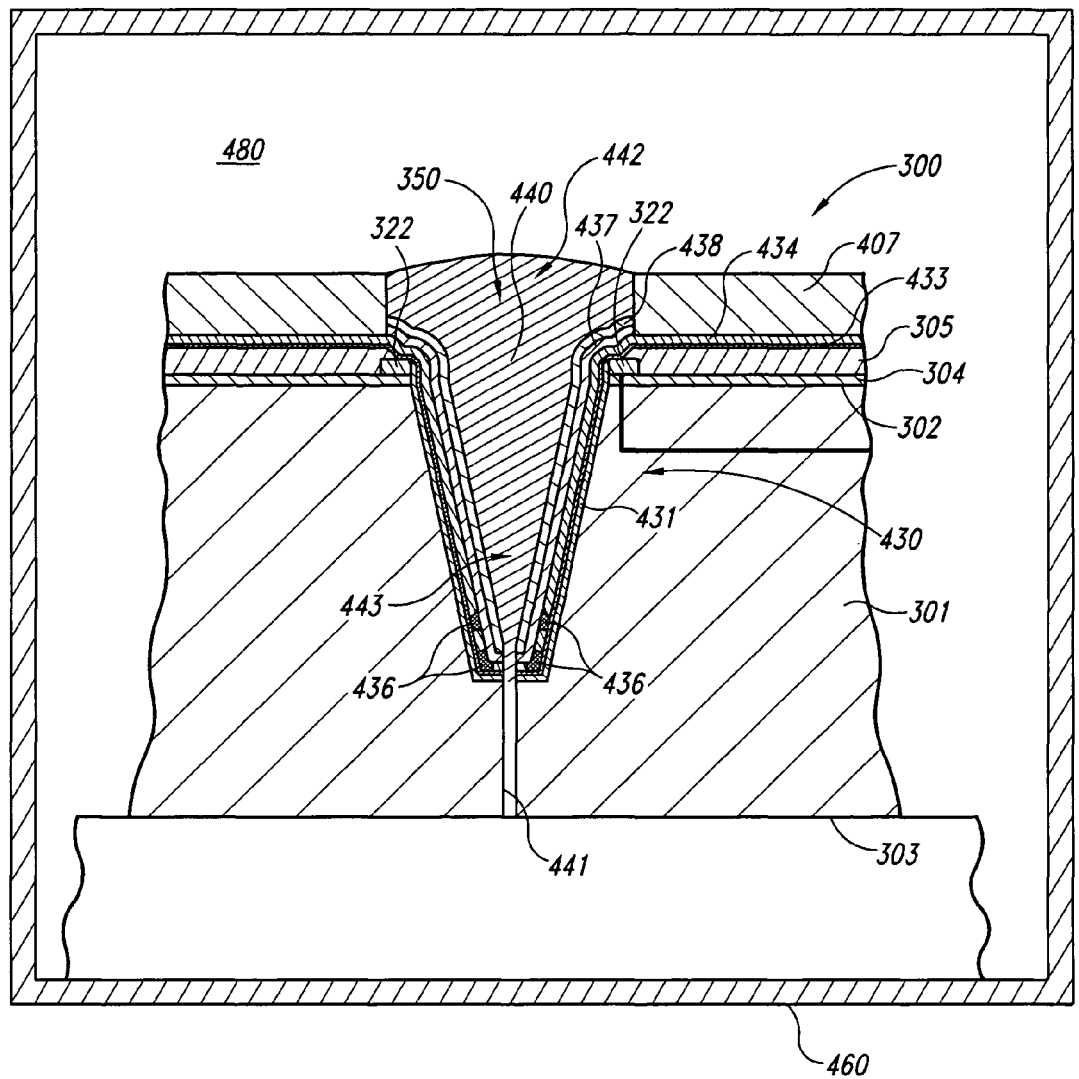

Referring next to FIG. 4H, a vent hole 441 is formed in the substrate 301 extending from a bottom portion of the via 350 to the second side 303 of the substrate 301. The vent hole 441 can be formed using a laser to cut through the substrate 301 from the second side 303 to the bottom of the via 350. The laser can be aligned with the via 350 and/or the corresponding bond site 322 using scanning/alignment systems known in the art. A suitable laser is the Xise200, commercially available from Xsil Ltd. of Dublin, Ireland. After forming the vent hole 441, it is generally cleaned to remove ablated byproducts (i.e., slag) and/or other undesirable byproducts resulting from the laser. For example, the vent hole 441 can be cleaned using a suitable cleaning agent, such as 6% tetramethylammonium hydroxide (TMAH): propylene glycol. In other embodiments, the vent hole 441 may not be cleaned. In alternative embodiments, the vent hole 441 can be a different size or shape, and may be formed using an etching process (e.g., a dry etch and/or a wet etch), a mechanical drilling process, a dicing or laser slot, or another suitable method.

In several embodiments, a temporary protective filling or coating 439 (shown in broken lines) can be deposited into the via 350 before forming the vent hole 441. The protective filling 439 can be a photoresist, a polymer, water, a solidified liquid or gas, or another suitable material. The protective filling 439 protects the sidewalls of the via 350 from slag produced during the laser drilling process. The slag can negatively affect the process of plating nickel onto the seed layer and/or wetting a conductive fill material in the via 350. The protective filling 439 can be removed after forming the vent hole 441.

Figure 4J:
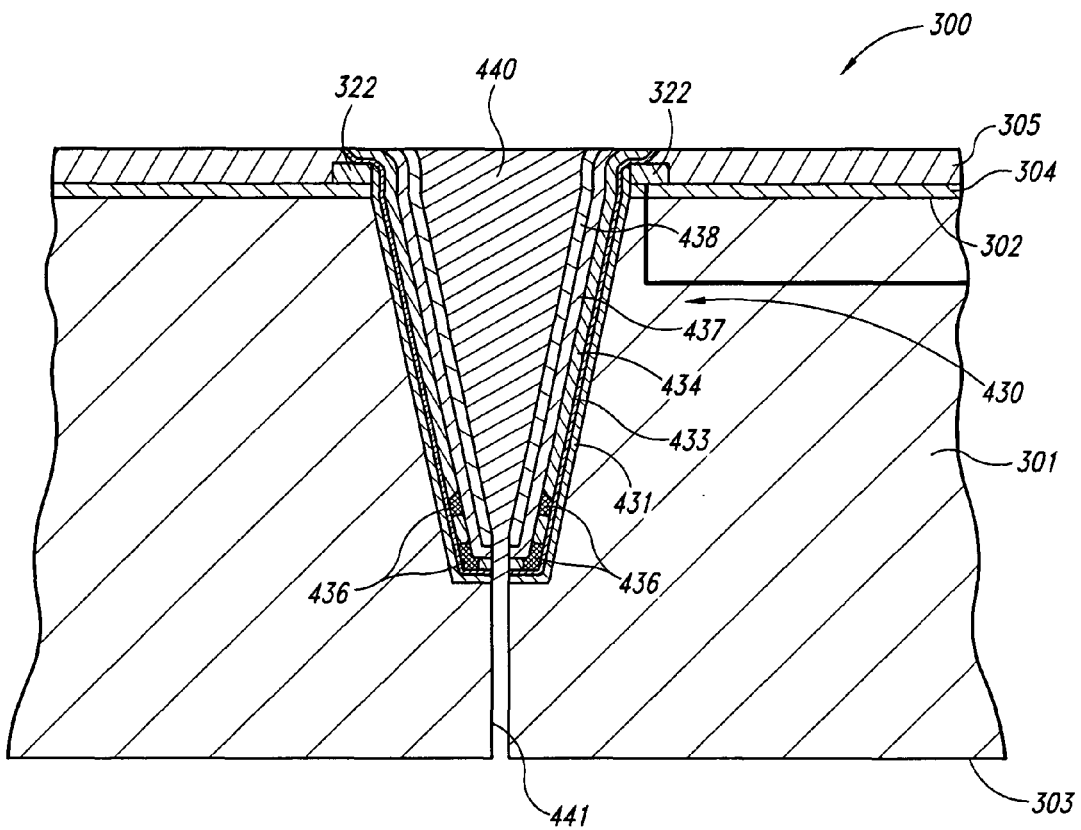

Referring next to FIG. 4J, a conductive fill material 440 is deposited into the via 350 to form an interconnect 430. The interconnect 430 has a first end 442 proximate to the bond site 322 and a second end 443 at the bottom of the via 350. The fill material 440 can include Cu, Ni, Co, Ag, Au, solder, or other suitable materials or alloys of materials having the desired conductivity. The conductive fill material 440 can be deposited into the via 350 using a supercritical fluid technique, generally similar to those described above.

The resist layer 407 can then be removed from the substrate 301 (as shown in FIG. 4J) and a suitable etching process can be used to remove the remaining portions of the seed layer 434 and barrier layer 433 on the first side 302 of the substrate 301. The first side 302 of the substrate 301 can be planarized using grinding, chemical mechanical planarization (CMP), and/or other suitable processes. The via 350 can initially be a blind via that can be made to extend entirely through the substrate by a backgrinding process described below with reference to FIG. 4K.

Figure 4K:
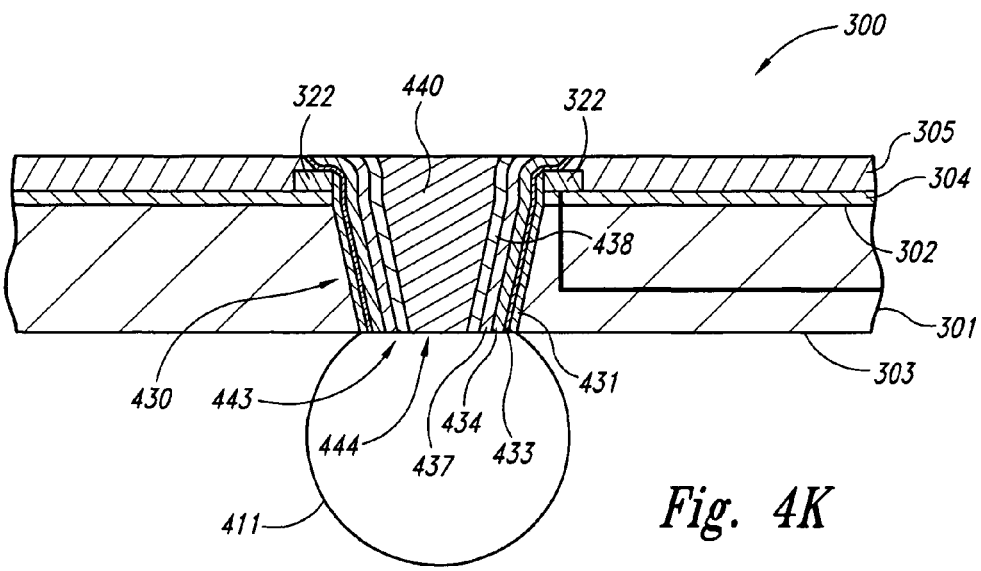

FIG. 4K illustrates the substrate 301 after material has been removed from the second surface 303 in a process that exposes the second end 433 of the interconnect structure 430. Accordingly, the second end 443 of the interconnect structure 430 can form a second bond site 444 to which the solder ball 411 can be attached for coupling the workpiece 301 to external devices. The interconnect structure 430 can extend for a significant distance in the substrate 301 from the first side 302. For example, the interconnect structure 430 can extend for at least 100 microns in some embodiments, and for 150 microns or more in other embodiments.

Figure 1B:
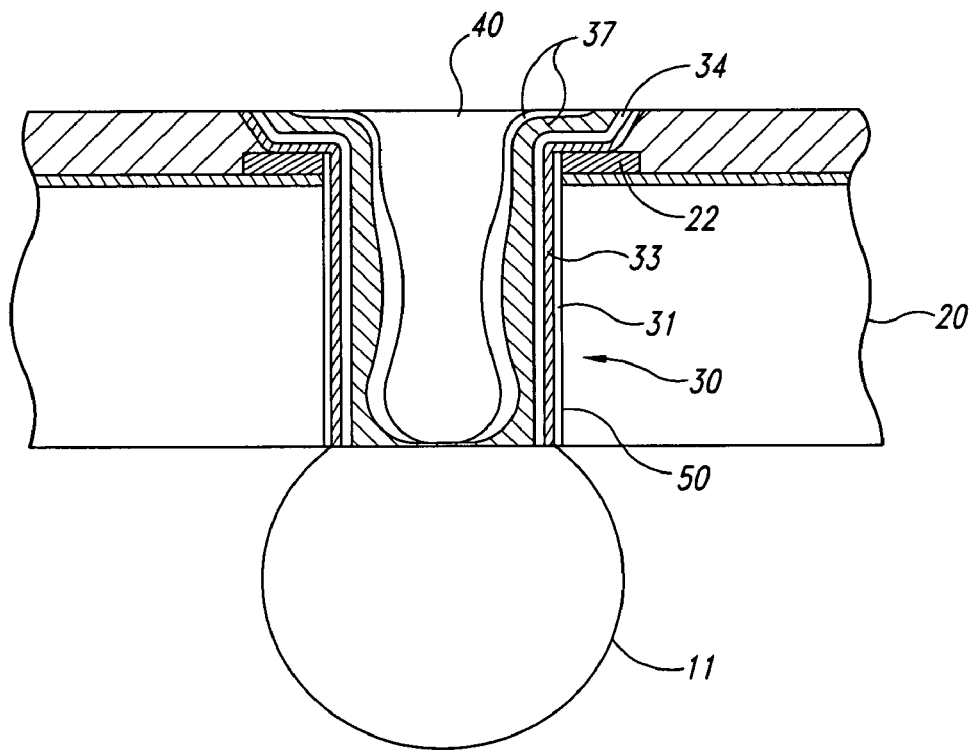

One feature of several of the embodiments described above with reference to FIGS. 2-4K is that the conductive materials can be disposed in the via 350 while the via 350 is exposed to a supercritical fluid. An advantage of this arrangement is that when the precursor gas is introduced into the supercritical fluid, it tends to be distributed uniformly throughout the fluid. Accordingly, the concentration of the conductive constituents in the supercritical fluid tends to remain uniform, even as the conductive material precipitates from the supercritical fluid. As a result, the concentration of the conductive material can remain generally constant throughout the via, even though the via may have a high aspect ratio (e.g., at least 1:1), and a significant depth (e.g., at least 100 microns). Because the concentration of the conductive constituents can remain generally constant throughout the via, the conductive constituents are expected to be generally uniform on the sidewalls and the bottom of the via as they precipitate from the supercritical fluid. This is unlike some existing arrangements, in which other deposition techniques, (e.g., electrodeposition and/or electroless deposition) may tend to deposit the conductive material in a non-uniform manner, as described above with reference to FIG. 1B. To address this problem, some existing methods rely on a forward (plating) step, followed by a backward (deplating) step to create a layer that extends through the via without being overly thick toward the via entrance. However, a problem with this technique is that it can be time-consuming, and may produce a scalloped or otherwise non-uniform layer.

Additional features of the supercritical fluid are that it generally has a low viscosity, low surface tension and high diffusivity. These characteristics also aid in providing uniform material deposition. Accordingly, these characteristics can improve the conductivity and robustness of the interconnect structures formed in a supercritical fluid environment.

In different embodiments, a manufacturer may elect to use aspects of the foregoing supercritical fluid deposition process for some or all of the conductive materials used to form the interconnect structure. For example, as described above, the supercritical fluid technique can be used to deposit the seed layer on the barrier layer. In some cases, depositing the seed layer using this technique is sufficient to provide the desired level of deposition uniformity for subsequent layers. In other embodiments, some or all of the additional layers may also be deposited using a supercritical fluid technique. For example, the copper and/or nickel layers may be deposited using such techniques. In other embodiments, other deposition techniques (e.g., techniques such as electroplating or electroless plating) may be used for these subsequent deposition steps. In still further embodiments, electroplating or electroless plating techniques may be used for the seed layer deposition, while supercritical fluid techniques are used to form subsequent layers. In still further embodiments, assuming a suitable precursor gas is available, the solder fill material can be deposited using a supercritical fluid technique.

Figure 5:
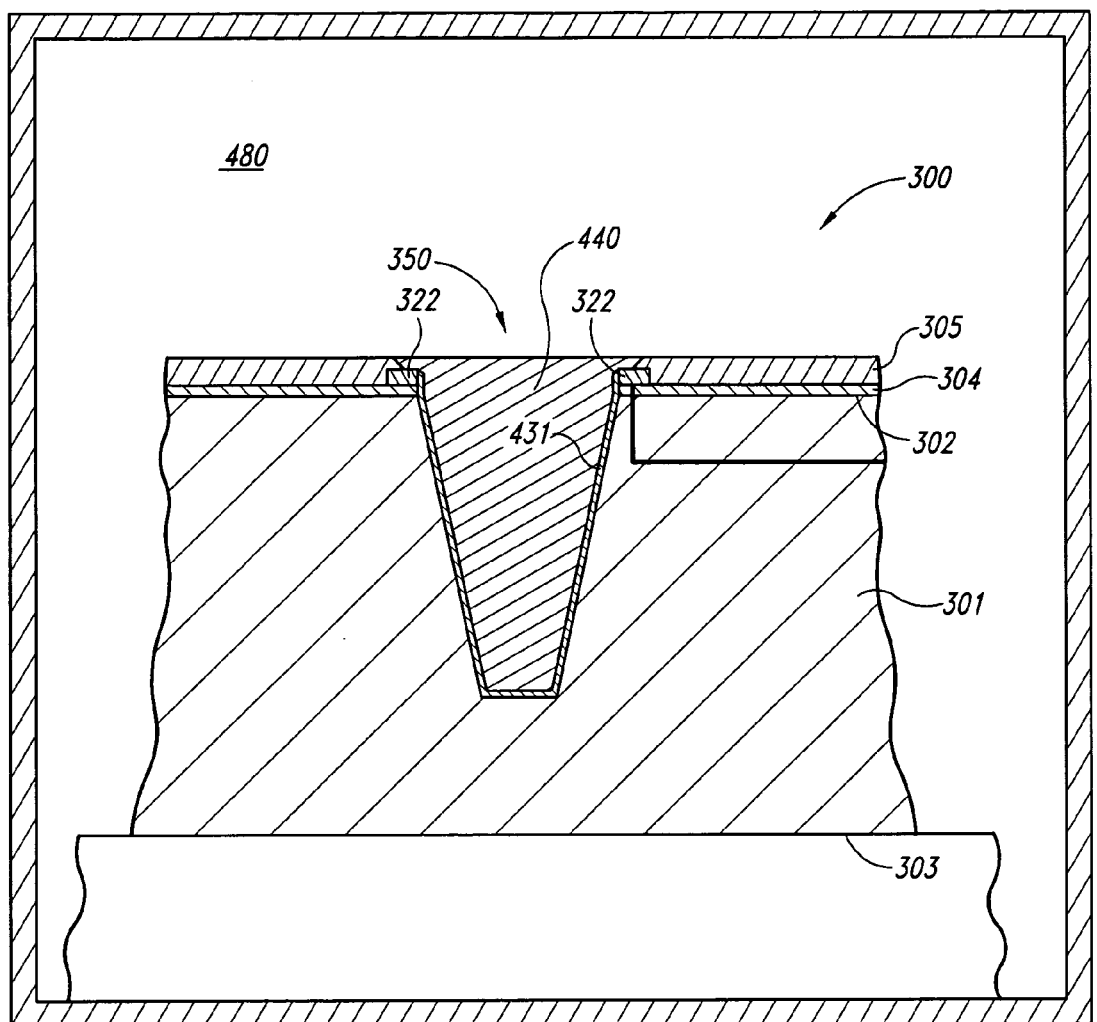
FIG. 5 illustrates an interconnect structure having a reduced number of discrete layers, and an increased grain size uniformity in accordance with another embodiment of the invention.

In yet another embodiment, the supercritical fluid technique can be used to deposit material directly onto the barrier layer in a single, continuous process that proceeds at least until the via is filled. FIG. 5 illustrates the via 350 filled uniformly with a single fill material deposited in a single continuous step. In one aspect of this embodiment, the fill material can include copper, but in other embodiments, the fill material can include other conductive constituents. In certain of these embodiments, the fill material can be selected not to include solder, and can instead include more highly conductive materials with higher melting points. These materials, in addition to providing better performance through better conductivity, allow the workpiece to undergo further processing at higher temperatures. In many of the foregoing embodiments described with reference to FIG. 5, the fill material 440 can have a single, generally homogeneous crystal structure throughout the via 350 (e.g., across the width of the via 350 and throughout the depth of the via 350). This is unlike typical existing interconnect structures, which include one crystal structure for the seed layer and other crystal structures for the one or more subsequent conductive layers disposed on the seed layer. An advantage of the generally homogeneous crystal structure is that it may be less subject to disruptions and/or discontinuities which can affect the integrity of the interconnect. Another advantage is that disposing the conductive material in the via in a single continuous process can reduce the time and expense associated with forming the via, and can accordingly make the process for forming devices in which the via is positioned more cost effective.

Figure 6:
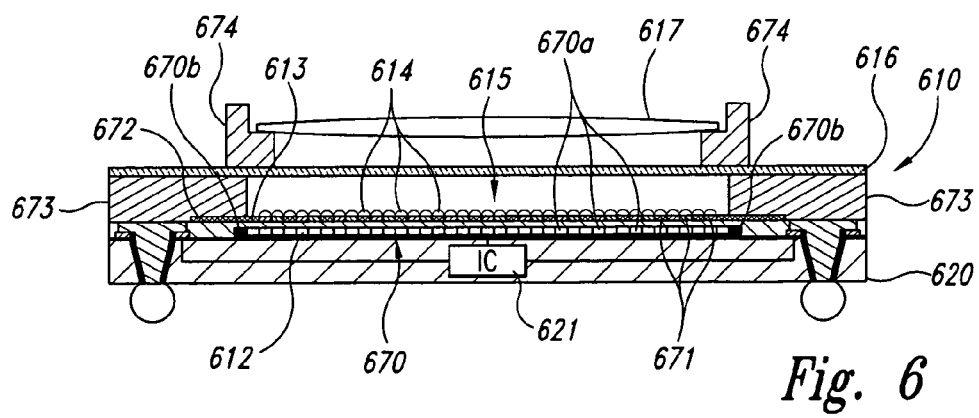
FIG. 6 illustrates an imaging device that includes through-wafer interconnects configured in accordance with an embodiment of the invention.

FIG. 6 is a partially schematic illustration of a finished imaging device 610 configured in accordance with an embodiment of the invention. The imaging device 610 can include a die 620 having an integrated circuit 621 coupled to an image sensor 612, which can in turn include an array of pixels 670 arranged in a focal plane. In the illustrated embodiment, for example, the image sensor 612 can include a plurality of active pixels 670a arranged in a desired pattern, and at least one dark current pixel 670b located at a perimeter portion of the image sensor 612 to account for extraneous signals in the die 610 that might otherwise be attributed to a sensed image. In other embodiments, the arrangement of pixels 670 may be different.

A color filter array (CFA) 613 is positioned over the active pixels 670a of the sensor 612. The CFA 613 has individual filters or filter elements 671 configured to allow the wavelengths of light corresponding to selected colors (e.g., red, green, or blue) to pass to each pixel 670 of the image sensor 612. In the illustrated embodiment, for example, the CFA 613 is based on the RGB color model, and includes red filters, green filters, and blue filters arranged in a desired pattern over the corresponding active pixels 670a. The CFA 613 can further include a residual blue section 672 that extends outwardly from a perimeter portion of the image sensor 612. The residual blue section 672 helps prevent back reflection from the various components within the die 610.

The imaging device 610 can further include a plurality of microlenses 614 arranged in a microlens array 615 over the CFA 613. The microlenses 614 are used to focus light onto the initial charge accumulation regions of the image sensor pixels 613. Standoffs 673 are positioned adjacent to the microlens array 615 to support a transmissive element 616. The transmissive element 616 (which can include glass) is positioned to protect the microlens array 615 and other features of the die 620 from contamination. Lens standoffs 674 can be mounted to the transmissive element 616 to support a device lens 617. The device lens 617 is positioned a selected distance away from the microlens array 615 to focus light onto the microlens array 615 and ultimately onto the image sensor 612.

From the foregoing, it will be appreciated that specific embodiments of the invention have been described herein for purposes of illustration, but that various modifications may be made without deviating from the invention. For example, while aspects of the invention have been described in the context of image sensor devices, these aspects may be applied to other devices as well. In particular embodiments, aspects of the invention have been described in the context of integrated circuit devices coupled to interconnect structures formed in accordance with particular methods. In other embodiments, the interconnect structures can be coupled to other microelectronic features, for example, capacitors or conductive lines. Aspects of the invention described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

I claim:

1. A method for processing a substrate, comprising:
   forming a via in a substrate having a first surface and a second surface opposite the first surface, the substrate including a bond site at least proximate to the first surface, the via having an opening proximate to the bond site of the substrate, the opening having a width, a bottom portion in the substrate, and a sidewall with a length generally transverse to the width, the length being approximately 100 microns or more;
   contacting the sidewall of the via with a precursor of a conductive material in a supercritical fluid;
   precipitating the conductive material from the precursor in the supercritical fluid onto the sidewall of the via;

maintaining a generally uniform concentration of the precursor in the supercritical fluid throughout the via as the conductive material is precipitated from the precursor;

forming a conformal layer of the conductive material on the sidewall of the via from the precipitated conductive material while the via is exposed to the supercritical fluid, the layer of the conductive material having a generally uniform thickness over substantially the entire length of the via in a direction transverse to the width of the via;

after forming the conformal layer, forming a vent hole in the substrate extending from the bottom portion of the via to the second surface of the substrate;

filling the via with a fill material adjacent to the conformal layer of the conductive material after forming the vent hole, the fill material having a first end proximate to the first surface;

exposing a second end of the fill material opposite the first end by removing material from the second surface of the substrate; and attaching a solder ball to the exposed second end of the fill material, the solder ball being in electrical communication with the bond site of the substrate via the fill material in the via.

2. The method of claim 1 wherein precipitating the conductive material includes performing a reduction reaction in the supercritical fluid.

3. The method of claim 1 wherein precipitating the conductive material includes combining a metal-containing precursor with a supercritical carbon dioxide solvent.

4. The method of claim 1 wherein precipitating the conductive material includes combining a metal-containing precursor with a supercritical non-polar solvent.

5. The method of claim 1 wherein precipitating the conductive material includes disposing a first conductive material on the sidewall of the via, and wherein the method further comprises disposing a second conductive material in the via adjacent to the first conductive material.

6. The method of claim 1 wherein precipitating the conductive material includes disposing a conductive material while the via is exposed to supercritical carbon dioxide.

7. The method of claim 1 wherein precipitating the conductive material includes disposing a seed layer along the sidewall of the via.

8. The method of claim 1 wherein precipitating the conductive material includes:
    exposing the via to the supercritical fluid;
    introducing the precursor of the conductive material into the supercritical fluid;
    reducing the precursor of the conductive material by introducing an additional chemical specie, or elevating a temperature of the supercritical fluid, or both; and
    causing the conductive material to precipitate from the supercritical fluid.

9. The method of claim 1, further comprising removing an organic material from a surface of the sidewall of the via with the supercritical fluid before precipitating the conductive material in the via.

10. The method of claim 1, further comprising removing a photoresist material from a surface of the sidewall of the via with the supercritical fluid before precipitating the conductive material in the via.

11. The method of claim 1 wherein precipitating the conductive material includes disposing the conductive material in a generally continuous process.

12. The method of claim 1 wherein precipitating the conductive material includes disposing the conductive material in a generally continuous process without disposing a seed layer in the via.

13. The method of claim 1 wherein precipitating the conductive material includes disposing the conductive material while the conductive material has a generally uniform concentration gradient in the supercritical fluid along a length of the via.

14. The method of claim 1 wherein the substrate has a first surface and a second surface facing away from the first surface, and wherein forming the via includes forming the via to extend through the substrate from the first surface to the second surface.

15. The method of claim 1 wherein precipitating the conductive material includes forming at least a portion of a through-wafer interconnect.

16. The method of claim 1 wherein precipitating the conductive material includes forming at least a portion of a through-wafer interconnect, and wherein the method further comprises:
    electrically coupling a first conductive structure of the through-wafer interconnect to a feature within the substrate; and
    electrically coupling a second conductive structure of the through-wafer interconnect to a feature external to the substrate.

17. The method of claim 1 wherein precipitating the conductive material includes disposing at least one of copper and a copper compound.

18. The method of claim 1 wherein precipitating the conductive material includes disposing a generally homogeneous conductive material.

19. The method of claim 1 wherein precipitating the conductive material includes disposing the conductive material to have a generally uniform grain structure.

20. The method of claim 1 wherein precipitating the conductive material includes a portion of a process for forming a through-wafer interconnect, and wherein forming the through-wafer interconnect includes forming the through-wafer interconnect without solder.

21. A method for processing a substrate, comprising:
    forming a via in a substrate having a first surface and a second surface opposite the first surface, the substrate having a bond site proximate to the first surface, the via having an opening with a width, a bottom portion in the substrate, and a sidewall with a length generally transverse to the width, the length being approximately 100 microns or more; and
    exposing the sidewall of the via to supercritical carbon dioxide;
    introducing a conductive material precursor into the supercritical carbon dioxide;
    reducing the conductive material precursor by introducing an additional chemical specie, or elevating a temperature of the supercritical carbon dioxide, or both;
    causing the conductive material to precipitate from the supercritical carbon dioxide to form a conformal layer of the conductive material on the sidewall of the via; and
    maintaining a generally uniform concentration of the precursor in the supercritical fluid through out the via as the conductive material is precipitated from the precursor;
    after forming the conformal layer, forming a vent hole in the substrate extending from the bottom portion of the via to the second surface of the substrate;

filling the via with a fill material adjacent to the conformal layer of the conductive material after forming the vent hole, the fill material having a first end proximate to the first surface;

exposing a second end of the fill material opposite the first end by removing material from the second surface of the substrate; and attaching a solder ball to the exposed second end of the fill material, the solder ball being in electrical communication with the bond site of the substrate via the fill material in the via.

22. The method of claim 21 wherein introducing a conductive material precursor includes introducing a precursor containing at least one of nickel and copper.

23. The method of claim 21 wherein introducing a conductive material precursor includes introducing $Cu(tmhd)_2$.

24. The method of claim 21 wherein reducing the conductive material includes reducing the conductive material with hydrogen.

25. The method of claim 21 wherein causing the conductive material to precipitate includes (a) causing the conductive material to precipitate on the sidewall of the via, and (b) continuing to cause the conductive material to precipitate until the via is at least approximately filled.

26. The method of claim 21, further comprising filling the via with a conductive material having a homogeneous composition and structure.

27. The method of claim 21 wherein exposing the via to supercritical carbon dioxide includes exposing the via to supercritical carbon dioxide having a homogeneous composition, and wherein introducing a conductive material precursor includes introducing the precursor so that the conductive material has a homogeneous concentration distribution in the supercritical carbon dioxide.

28. The method of claim 21 wherein reducing the conductive material precursor includes reducing the conductive material precursor at a temperature of from about 60 degrees C. to about 250 degrees C.

29. A method for processing a substrate, comprising:
forming a via in a substrate having a first surface and a second surface opposite the first surface, the substrate including a bond site proximate to the first surface, the via having an opening with a width, a bottom portion in the substrate, and a sidewall with a length generally transverse to the width;

disposing an organic material on a surface of the substrate and on a sidewall of the via;

contacting the sidewall of the via with a precursor of a conductive material in a supercritical fluid;

precipitating the conductive material from the precursor in the supercritical fluid onto the sidewall of the via while the supercritical fluid removes at least a portion of the organic material;

maintaining a generally uniform concentration of the precursor in the supercritical fluid through out the via as the conductive material is precipitated from the precursor; and forming a conformal layer of the conductive material on the sidewall of the via from the precipitated conductive material while the via is exposed to the supercritical fluid, the layer of the conductive material having a generally uniform thickness over substantially the entire length of the via in a direction transverse to the width of the via;

after forming the conformal layer, forming a vent hole in the substrate extending from the bottom portion of the via to the second surface of the substrate;

filling the via with a fill material adjacent to the conformal layer of the conductive material, after forming the vent hole, the fill material having a first end proximate to the first surface;

exposing a second end of the fill material opposite the first end by removing material from the second surface of the substrate; and attaching a solder ball to the exposed second end of the fill material, the solder ball being in electrical communication with the bond site of the substrate via the fill material in the via.

30. The method of claim 29 wherein forming a conformal layer of the conductive material includes introducing the precursor having a conductive constituent into the supercritical fluid, while the via is exposed to the supercritical fluid.

31. The method of claim 29 wherein forming a conformal layer of the conductive material includes:
introducing the precursor into the supercritical fluid;
reducing the precursor by introducing an additional chemical specie, or elevating a temperature of the supercritical fluid, or both; and
causing the conductive material to precipitate from the supercritical fluid and occupy space in the via.

32. The method of claim 29 wherein disposing an organic material includes disposing a photoresist material.

33. The method of claim 29 wherein forming a via includes forming a via having a width and a length generally transverse to the width, the length being approximately 100 microns or more.

34. A method for processing a substrate, comprising:
forming a via in a substrate having a first surface and a second surface opposite the first surface, the via having an opening proximate to the first surface of the substrate, the opening having a width, a bottom portion in the substrate, and a sidewall with generally transverse to the width;

contacting the sidewall of the via with a precursor of a conductive material in a supercritical fluid;

precipitating the conductive material from the precursor in the supercritical fluid onto the sidewall of the via, thereby forming a conformal layer of the conductive material on the sidewall of the via;

after forming the conformal layer, forming a vent hole in the substrate extending from the bottom portion of the via to the second surface of the substrate; and filling the via with a fill material adjacent to the conformal layer of the conductive material after forming the vent hole.

35. The method of claim 34 wherein precipitating the conductive material includes performing a reduction reaction in the supercritical fluid.

36. The method of claim 34 wherein precipitating the conductive material includes combining a metal-containing precursor with a supercritical carbon dioxide solvent.

37. The method of claim 34 wherein precipitating the conductive material includes combining a metal-containing precursor with a supercritical non-polar solvent.

38. The method of claim 34 wherein precipitating the conductive material includes disposing the conductive material while the via is exposed to supercritical carbon dioxide.

39. The method of claim 34 wherein precipitating the conductive material includes disposing a seed layer along the sidewall of the via.

40. The method of claim 34, further comprising:
removing material from the second surface of the substrate;
exposing an end of the fill material; and
attaching a solder ball to the exposed end of the fill material.

* * * * *